United States Patent
Kim et al.

(10) Patent No.: US 12,490,536 B2
(45) Date of Patent: Dec. 2, 2025

(54) IMAGE SENSOR

(71) Applicant: SAMSUNG ELECTRONICS CO., LTD., Suwon-si (KR)

(72) Inventors: Kook Tae Kim, Hwaseong-si (KR); Miseon Park, Hwaseong-si (KR); Jaesung Hur, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 342 days.

(21) Appl. No.: 17/739,682

(22) Filed: May 9, 2022

(65) Prior Publication Data

US 2022/0310676 A1 Sep. 29, 2022

Related U.S. Application Data

(63) Continuation of application No. 17/667,962, filed on Feb. 9, 2022.

(30) Foreign Application Priority Data

Mar. 26, 2021 (KR) ........................ 10-2021-0039457

(51) Int. Cl.
*H01L 27/146* (2006.01)
*H10F 39/00* (2025.01)

(52) U.S. Cl.
CPC ....... *H10F 39/807* (2025.01); *H10F 39/8053* (2025.01); *H10F 39/8063* (2025.01); *H10F 39/811* (2025.01)

(58) Field of Classification Search
CPC ........... H01L 27/1463; H01L 27/14621; H01L 27/15627; H01L 27/14636; H10F 39/807;
(Continued)

(56) References Cited

U.S. PATENT DOCUMENTS 8,664,578 B2 3/2014 Hirigoyen et al.
8,964,081 B2 2/2015 Ohkiubo et al.
(Continued)

FOREIGN PATENT DOCUMENTS

CN 110085613 A 8/2019
JP 2019-165136 9/2019
(Continued)

OTHER PUBLICATIONS

Examination Report dated Mar. 21, 2025 issued in corresponding Korean Patent Application No. 10-2021-0039457.
(Continued)

*Primary Examiner* — Igwe U Anya
(74) *Attorney, Agent, or Firm* — Morgan, Lewis & Bockius LLP

(57) ABSTRACT

An image sensor includes a semiconductor substrate having a first surface and a second surface opposite to the first surface, a first pixel isolation structure disposed in a first trench which vertically extends from the first surface of the semiconductor substrate and defines a plurality of pixel regions, and a second pixel isolation structure disposed in a second trench vertically extending from the second surface of the semiconductor substrate. The second pixel isolation structure overlaps the first pixel isolation structure. The first pixel isolation structure includes a liner semiconductor pattern defining a gap region in the first trench, the liner semiconductor pattern including sidewall portions and a bottom portion connecting the sidewall portions, a liner insulating pattern disposed between the liner semiconductor pattern and the semiconductor substrate, and a capping insulating pattern disposed in the gap region of the liner semiconductor pattern.

20 Claims, 21 Drawing Sheets

(58) Field of Classification Search
CPC . H10F 39/8063; H10F 39/8053; H10F 39/811
USPC .......................................................... 257/446
See application file for complete search history.

(56) References Cited

U.S. PATENT DOCUMENTS

| | | | |
|---|---|---|---|
| 9,054,007 B2 | 6/2015 | Hu et al. | |
| 9,190,441 B2 | 11/2015 | Lai et al. | |
| 9,761,624 B2 | 9/2017 | Velichko et al. | |
| 10,032,819 B2 | 7/2018 | Lee et al. | |
| 10,079,259 B2 | 9/2018 | Yu et al. | |
| 10,461,109 B2 | 10/2019 | Wu et al. | |
| 10,498,947 B2 | 12/2019 | Cheng et al. | |
| 10,700,114 B2 | 6/2020 | Honda et al. | |
| 11,257,857 B2 | 2/2022 | Hur et al. | |
| 12,027,554 B2 | 7/2024 | Yang et al. | |
| 2012/0153127 A1 | 6/2012 | Hirigoyen et al. | |
| 2016/0284746 A1* | 9/2016 | Fukase | H10F 39/80373 |
| 2017/0062496 A1 | 3/2017 | Lai et al. | |
| 2020/0111821 A1* | 4/2020 | Hong | H01L 27/14689 |
| 2020/0279877 A1* | 9/2020 | Kim | H01L 27/1463 |
| 2021/0020682 A1 | 1/2021 | Ihara | |
| 2021/0151478 A1 | 5/2021 | Iwabuchi | |
| 2021/0193706 A1* | 6/2021 | Kim | H01L 27/14689 |
| 2022/0238571 A1* | 7/2022 | Park | H10F 39/811 |

FOREIGN PATENT DOCUMENTS

| | | |
|---|---|---|
| KR | 10-0670606 | 1/2007 |
| KR | 10-2016-0087428 | 7/2016 |
| KR | 10-2019-0049459 | 5/2019 |
| KR | 10-2020-0086445 A | 7/2020 |
| TW | I694552 B | 5/2020 |

OTHER PUBLICATIONS

Office Action and Search Report dated Jul. 17, 2025 issued in Taiwanese Patent Application No. 111101491.

* cited by examiner

FIG. 3A
FIG. 3B
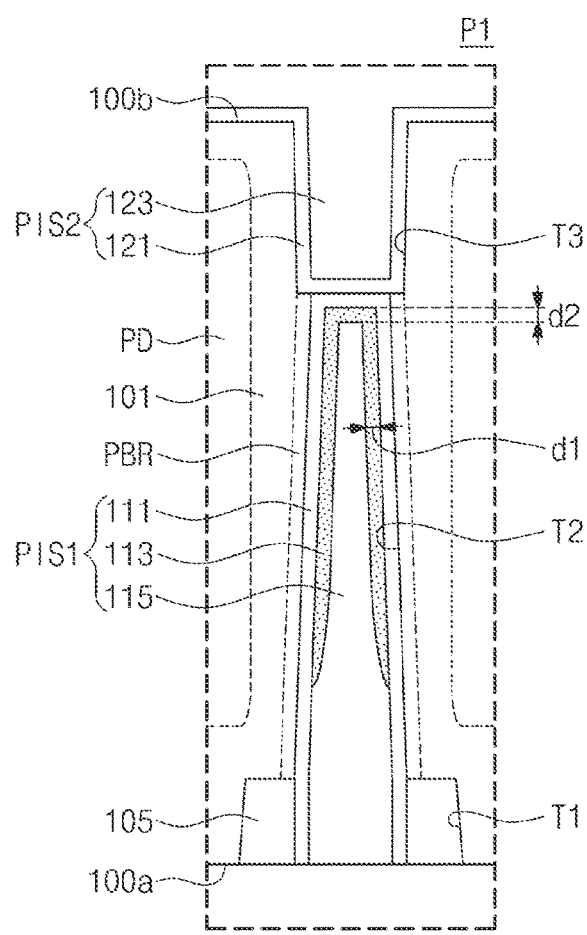
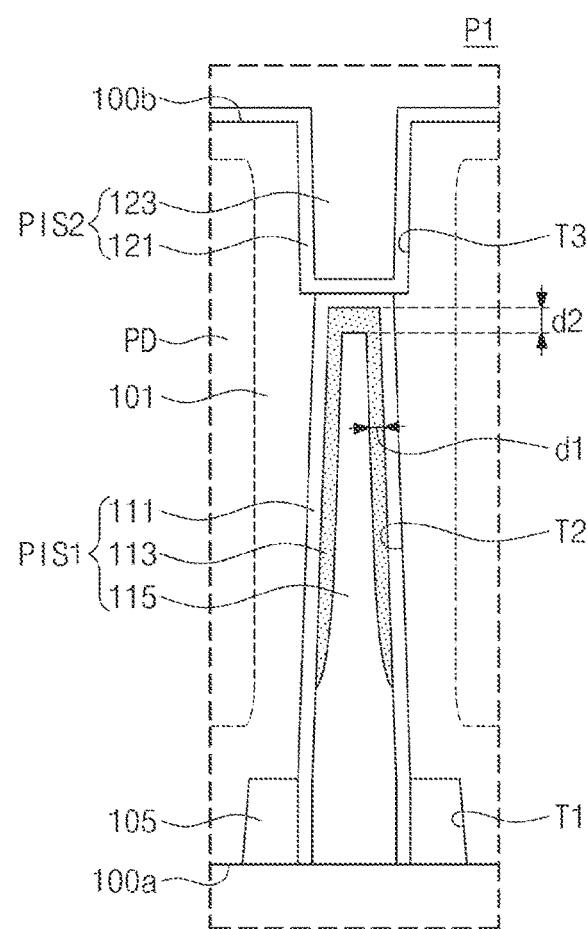

IMAGE SENSOR

CROSS-REFERENCE TO RELATED APPLICATION

This application is a continuation application of U.S. patent application Ser. No. 17/667,962 filed Feb. 9, 2022, which claims priority under 35 U.S.C. § 119 to Korean Patent Application No. 10-2021-0039457, filed on Mar. 26, 2021 in the Korean Intellectual Property Office, the disclosures of which are hereby incorporated by reference in their entirety.

TECHNICAL FIELD

Embodiments of the inventive concept relate to an image sensor and, more particularly, to an image sensor with improved electrical and optical characteristics.

DISCUSSION OF RELATED ART

An image sensor may convert an optical image into an electrical signal. As advancements in computer and communication industries are made, high-performance image sensors have been increasingly demanded in various fields. Such image sensors include, for example, a digital camera, a camcorder, a personal communication system (PCS), a game console, a security camera, and a medical micro camera.

Image sensors may be categorized as charge coupled device (CCD) image sensors and complementary metal-oxide-semiconductor (CMOS) image sensors. CMOS image sensors may have reduced size and low power consumption, and accordingly, may be widely used in various fields.

SUMMARY

Embodiments of the inventive concept provide an image sensor with improved electrical and optical characteristics.

In an embodiment, an image sensor includes a semiconductor substrate having a first surface and a second surface opposite to the first surface, a first pixel isolation structure disposed in a first trench which vertically extends from the first surface of the semiconductor substrate and defines a plurality of pixel regions, and a second pixel isolation structure disposed in a second trench vertically extending from the second surface of the semiconductor substrate. The second pixel isolation structure overlaps the first pixel isolation structure. The first pixel isolation structure includes a liner semiconductor pattern defining a gap region in the first trench, the liner semiconductor pattern including sidewall portions and a bottom portion connecting the sidewall portions, a liner insulating pattern disposed between the liner semiconductor pattern and the semiconductor substrate, and a capping insulating pattern disposed in the gap region of the liner semiconductor pattern.

In an embodiment, an image sensor includes a semiconductor substrate having a first surface and a second surface opposite to the first surface, a first pixel isolation structure vertically extending from the first surface toward the second surface of the semiconductor substrate and surrounding each of pixel regions, the first pixel isolation structure including a liner semiconductor pattern including sidewall portions and a bottom portion connecting the sidewall portions, a second pixel isolation structure vertically extending from the second surface toward the first surface of the semiconductor substrate and overlapping the first pixel isolation structure, and a backside contact plug penetrating a portion of the second pixel isolation structure and connected to the liner semiconductor pattern of the first pixel isolation structure.

In an embodiment, an image sensor includes a semiconductor substrate having a first conductivity type and having a first surface and a second surface opposite to the first surface; a first pixel isolation structure vertically extending from the first surface toward the second surface of the semiconductor substrate and surrounding each of pixel regions, the first pixel isolation structure including a liner semiconductor pattern including sidewall portions and a bottom portion connecting the sidewall portions, a liner insulating pattern between the semiconductor substrate and the liner semiconductor pattern, and a capping insulating pattern on the liner semiconductor pattern; a second pixel isolation structure vertically extending from the second surface toward the first surface of the semiconductor substrate and overlapping the first pixel isolation structure; a photoelectric conversion region disposed in the semiconductor substrate of each of the pixel regions and including dopants having a second conductivity type; a device isolation layer defining an active portion at the first surface of the semiconductor substrate in each of the pixel regions, the device isolation layer adjacent to the first surface of the semiconductor substrate; a transfer gate electrode disposed on the active portion of each of the pixel regions; a backside contact plug penetrating a portion of the second pixel isolation structure to be connected to the liner semiconductor pattern of the first pixel isolation structure; color filters corresponding to the pixel regions on the second surface of the semiconductor substrate; a grid structure disposed between the color filters and overlapping the second pixel isolation structure; and micro lenses on the color filters.

BRIEF DESCRIPTION OF THE DRAWINGS

The above and other features of the inventive concept will become more apparent by describing in detail embodiments thereof with reference to the accompanying drawings, in which:

FIGS. 3A to 3I are enlarged views of a portion 'P1' of FIG. 2 illustrating portions of image sensors according to some embodiments of the inventive concept.

DETAILED DESCRIPTION OF THE EMBODIMENTS

Figure 1:
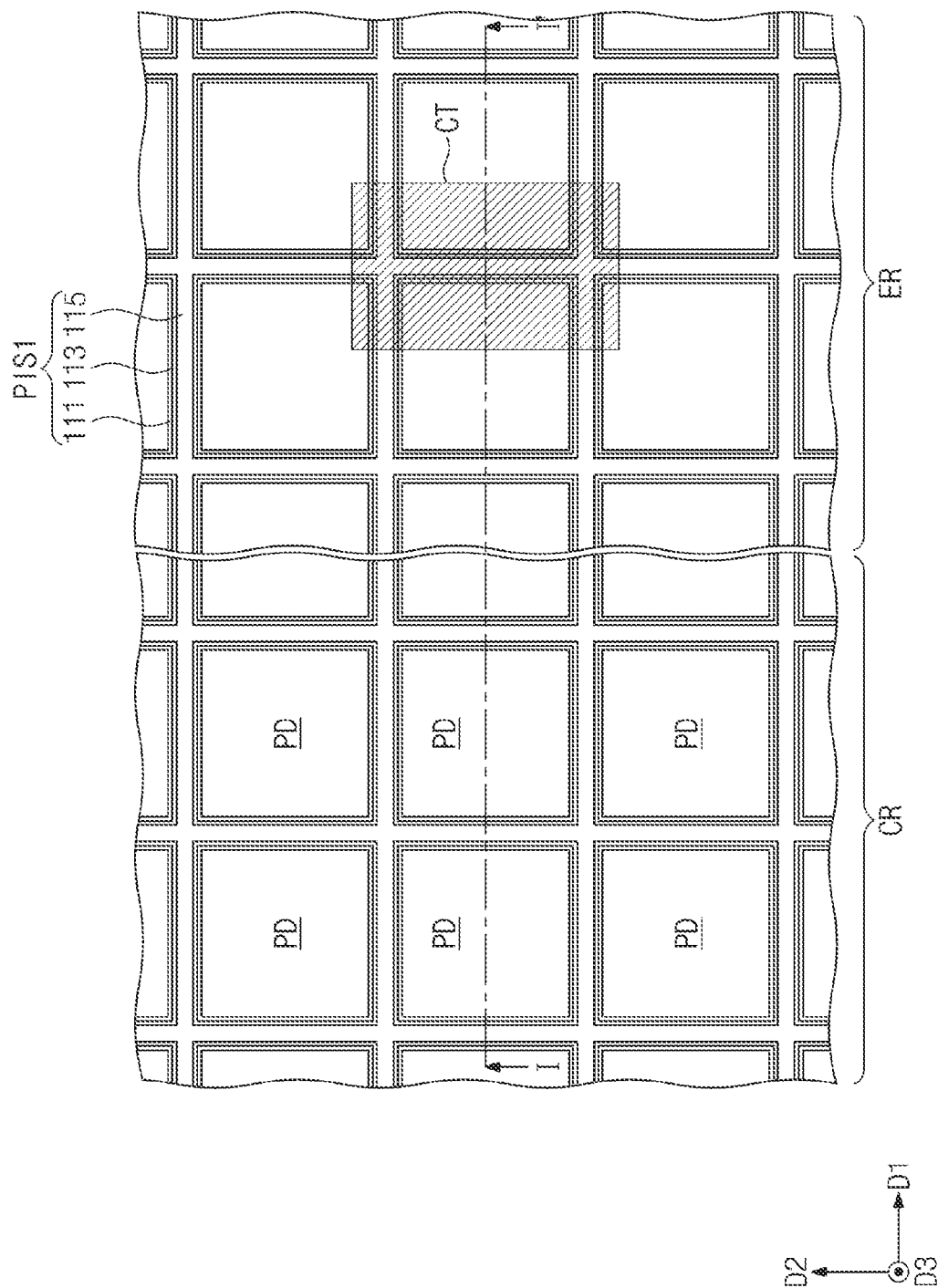
FIG. 1 is a plan view illustrating a portion of an image sensor according to some embodiments of the inventive concept.

Embodiments of the inventive concept will be described more fully hereinafter with reference to the accompanying drawings. Like reference numerals may refer to like elements throughout the accompanying drawings.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

An image sensor and a method of manufacturing the same according to some embodiments of the inventive concept will be described more fully hereinafter with reference to the accompanying drawings.

Figure 2:
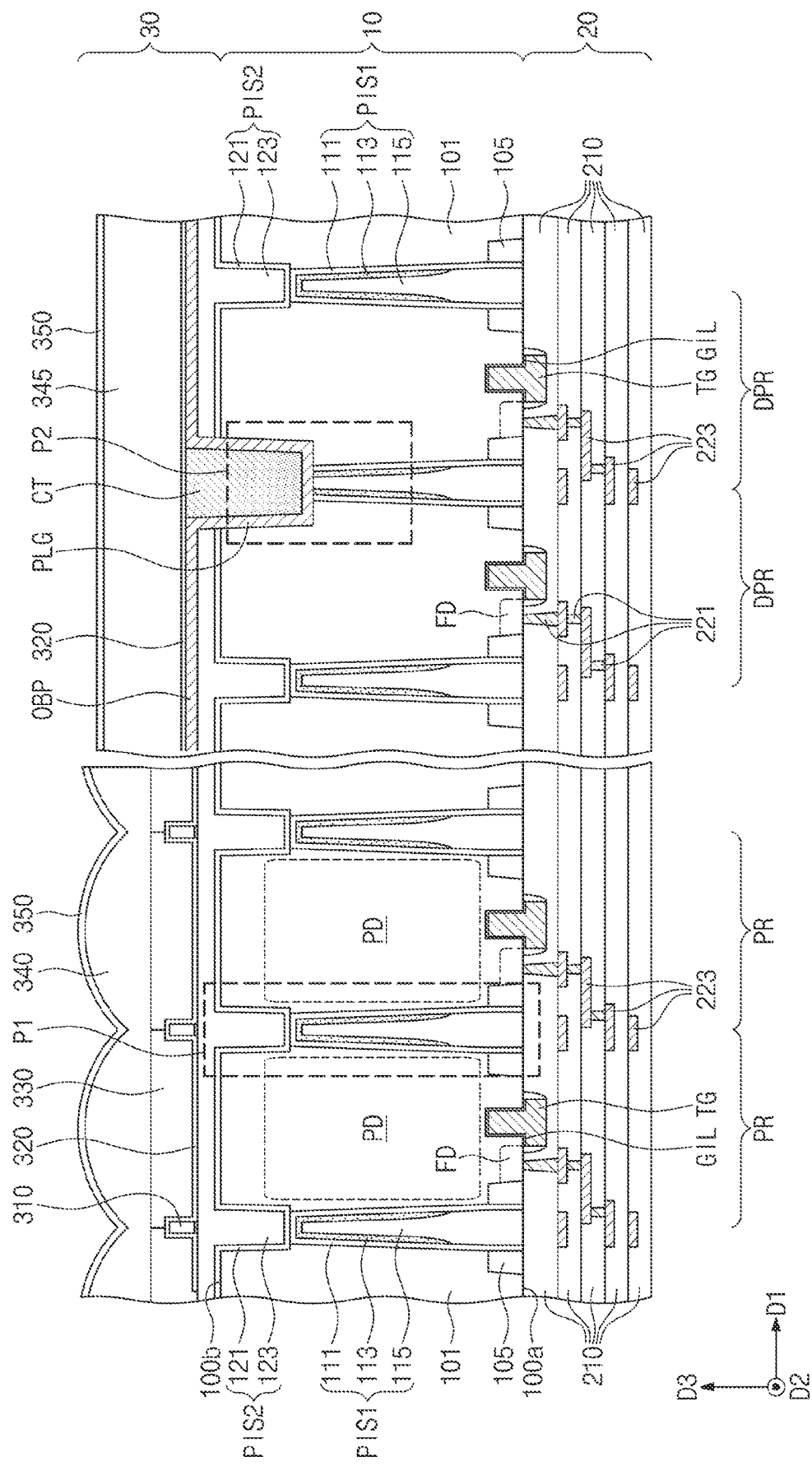
FIG. 2 is a cross-sectional view taken along line I-I' of FIG. 1 illustrating an image sensor according to some embodiments of the inventive concept.
Figure 3C:
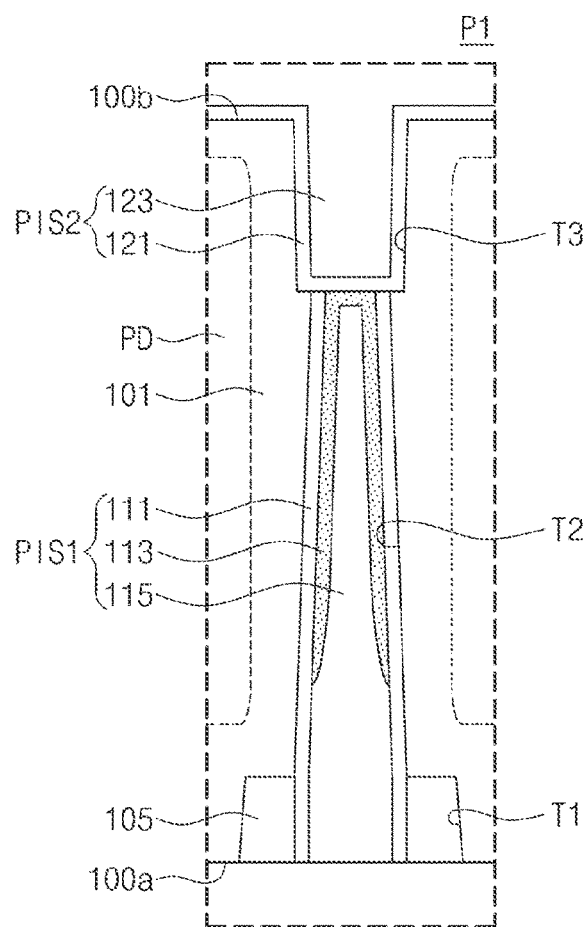
Figure 3D:
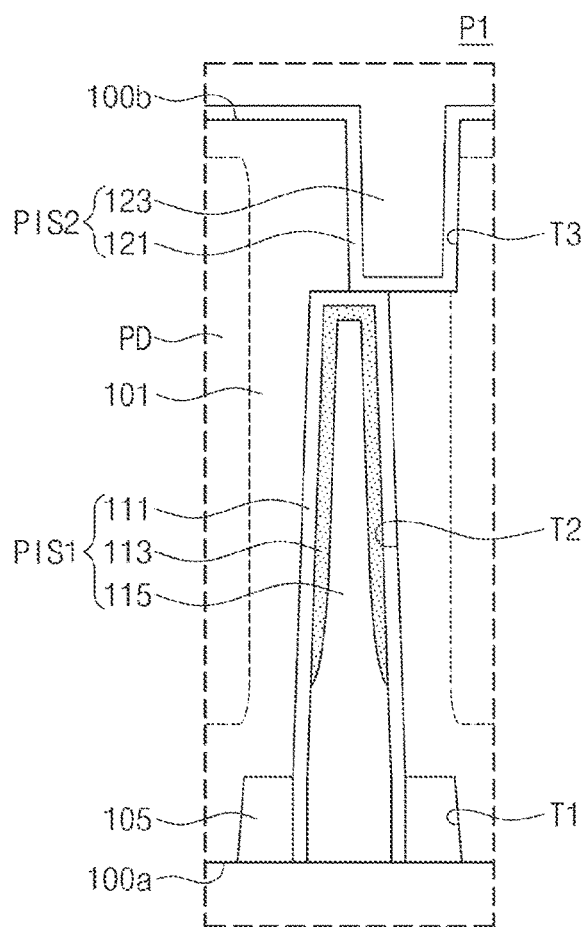

FIG. 1 is a plan view illustrating a portion of an image sensor according to some embodiments of the inventive concept. FIG. 2 is a cross-sectional view taken along line I-I' of FIG. 1 illustrating an image sensor according to some embodiments of the inventive concept. FIGS. 3A to 3I are enlarged views of a portion 'P1' of FIG. 2 illustrating portions of image sensors according to some embodiments of the inventive concept. FIG. 4 is an enlarged view of a portion 'P2' of FIG. 2 illustrating a portion of an image sensor according to some embodiments of the inventive concept.

Referring to FIGS. 1 and 2, an image sensor according to some embodiments of the inventive concept may include a photoelectric conversion layer 10, a readout circuit layer 20, and a light transmitting layer 30, in a cross-sectional view.

The photoelectric conversion layer 10 may be disposed between the readout circuit layer 20 and the light transmitting layer 30 in a cross-sectional view. Light incident from outside of the image sensor may be converted into electrical signals in photoelectric conversion regions PD. The photoelectric conversion layer 10 may include a semiconductor substrate 101, first and second pixel isolation structures PIS1 and PIS2, and the photoelectric conversion regions PD.

For example, the semiconductor substrate 101 may have a first surface (or a front surface) 100a and a second surface (or a back surface) 100b, which are opposite to each other. The semiconductor substrate 101 may be a substrate in which an epitaxial layer having a first conductivity type (e.g., a P-type) is formed on a bulk silicon substrate having the first conductivity type. In some embodiments, due to a process of manufacturing the image sensor, the semiconductor substrate 101 may be the P-type epitaxial layer remaining by removing the bulk silicon substrate. Alternatively, the semiconductor substrate 101 may be a bulk semiconductor substrate 101 including a well having the first conductivity type.

The semiconductor substrate 101 may include a central region CR and an edge region ER around the central region CR. The central region CR may include a plurality of pixel regions PR defined by the first and second pixel isolation structures PIS1 and PIS2, and the edge region ER may include a plurality of dummy pixel regions DPR defined by the first and second pixel isolation structures PIS1 and PIS2.

A device isolation layer 105 may be disposed adjacent to the first surface 100a of the semiconductor substrate 101 in each of the pixel regions PR. The device isolation layer 105 may be disposed in a first trench T1 (see FIG. 3A) formed by recessing the first surface 100a of the semiconductor substrate 101. The device isolation layer 105 may be formed of an insulating material. For example, the device isolation layer 105 may include a liner oxide layer and a liner nitride layer which conformally cover an inner surface of the first trench T1, and a filling oxide layer which fills the first trench T1 having the liner oxide layer and the liner nitride layer. The device isolation layer 105 may define an active portion at the first surface 100a of the semiconductor substrate 101.

The first pixel isolation structure PIS1 may extend in a direction (e.g., a third direction D3) perpendicular to the first surface 100a of the semiconductor substrate 101 and may be disposed in the semiconductor substrate 101. The first pixel isolation structure PIS1 may be disposed in a second trench T2 (see FIG. 3A) recessed from the first surface 100a of the semiconductor substrate 101.

The first pixel isolation structure PIS1 may penetrate a portion of the device isolation layer 105. The first pixel isolation structure PIS1 may define the plurality of pixel regions PR in the central region CR and may define the plurality of dummy pixel regions DPR in the edge region ER. Here, the first pixel isolation structure PIS1 may include first portions extending in parallel to each other in a first direction D1, and second portions extending in parallel to each other in a second direction D2 to intersect the first portions. The first pixel isolation structure PIS1 may continuously extend from the central region CR into the edge region ER in the first direction D1 and the second direction D2.

The first pixel isolation structure PIS1 may surround each of the pixel regions PR and each of the dummy pixel regions DPR when viewed in a plan view. The pixel regions PR may be isolated from each other in the first direction D1 and the second direction D2 by the first and second pixel isolation structures PIS1 and PIS2 in the central region CR. The dummy pixel regions DPR may be isolated from each other in the first direction D1 and the second direction D2 by the first and second pixel isolation structures PIS1 and PIS2 in the edge region ER. In other words, the pixel regions PR and the dummy pixel regions DPR may be two-dimensionally arranged in the first direction D1 and the second direction D2.

A top surface of the first pixel isolation structure PIS1 may be substantially coplanar with the first surface 100a of the semiconductor substrate 101. The top surface of the first pixel isolation structure PIS1 may be substantially coplanar with a top surface of the device isolation layer 105.

The first pixel isolation structure PIS1 may have a bottom surface between the first surface 100a and the second surface 100b of the semiconductor substrate 101. The first pixel isolation structure PIS1 may be spaced apart from the second surface 100b of the semiconductor substrate 101. The first pixel isolation structure PIS1 may have a first upper width at the first surface 100a of the semiconductor substrate 101 and may have a first lower width at the bottom surface thereof. The first lower width may be less than or substantially equal to the first upper width. For example, a width of the first pixel isolation structure PIS1 may become progressively less from the first surface 100a toward the second surface 100b of the semiconductor substrate 101. The first pixel isolation structure PIS1 may have a first length in the direction (e.g., the third direction D3) perpendicular to the first surface 100a of the semiconductor substrate 101.

In some embodiments, the first pixel isolation structure PIS1 may include a liner insulating pattern 111, a liner semiconductor pattern 113, and a capping insulating pattern 115.

Referring to FIG. 3A, the liner insulating pattern 111 may conformally cover an inner surface of the second trench T2 recessed from the first surface 100a of the semiconductor substrate 101. The liner insulating pattern 111 may be disposed between the liner semiconductor pattern 113 and the semiconductor substrate 101. The liner insulating pattern 111 may be in direct contact with the semiconductor substrate 101. A bottom surface of the liner insulating pattern 111 may be in contact with the second pixel isolation structure PIS2. The bottom surface of the liner insulating pattern 111 may be in contact with a portion of the second pixel isolation structure PIS2.

The liner insulating pattern 111 may include a material having a refractive index lower than that of the semiconductor substrate 101. For example, the liner insulating pattern 111 may include a silicon-based insulating material (e.g., silicon nitride, silicon oxide, and/or silicon oxynitride) and/or a high-k dielectric material (e.g., hafnium oxide and/or aluminum oxide). In embodiments, the liner insulating pattern 111 may include a plurality of layers, and the layers may include different materials.

The liner semiconductor pattern 113 may fill a portion of the second trench T2 having the liner insulating pattern 111. The liner semiconductor pattern 113 may conformally cover a portion of the liner insulating pattern 111. In other words, in an embodiment, the liner semiconductor pattern 113 is not disposed on an upper sidewall of the liner insulating pattern 111.

The liner semiconductor pattern 113 may include sidewall portions and a bottom portion connecting the sidewall portions, and a gap region may be defined in the second trench T2 by the sidewall portions and the bottom portion. The bottom portion of the liner semiconductor pattern 113 may be adjacent to the second surface 100b of the semiconductor substrate 101. Top surfaces of the sidewall portions of the liner semiconductor pattern 113 may be vertically spaced apart from the first surface 100a of the semiconductor substrate 101. In some embodiments, as illustrated in FIG. 3A, the top surfaces of the sidewall portions of the liner semiconductor pattern 113 may be located at a level between a bottom surface of the device isolation layer 105 and the second pixel isolation structure PIS2. In certain embodiments, as illustrated in FIGS. 3H and 3I, the top surfaces of the sidewall portions of the liner semiconductor pattern 113 may be located at a level between the bottom surface of the device isolation layer 105 and the first surface 100a of the semiconductor substrate 101.

According to some embodiments, each of the sidewall portions of the liner semiconductor pattern 113 may have a first thickness d1 on the liner insulating pattern 111. In addition, each of upper portions of the sidewall portions of the liner semiconductor pattern 113 may have a thickness which becomes progressively less toward the first surface 100a of the semiconductor substrate 101. In other words, the upper portions of the sidewall portions of the liner semiconductor pattern 113 may have tapered spacer shapes.

The bottom portion of the liner semiconductor pattern 113 may have a second thickness d2 on the liner insulating pattern 111. Here, the second thickness d2 may be substantially equal to or less than the first thickness d1. According to an embodiment illustrated in FIG. 3B, the bottom portion of the liner semiconductor pattern 113 may have a second thickness d2 greater than the first thickness d1 of the sidewall portion.

The bottom portion of the liner semiconductor pattern 113 may be in contact with the liner insulating pattern 111. In other words, a portion of the liner insulating pattern 111 may be disposed between the bottom portion of the liner semiconductor pattern 113 and the second pixel isolation structure PIS2. Alternatively, as illustrated in FIG. 3C, the bottom portion of the liner semiconductor pattern 113 may be in contact with the second pixel isolation structure PIS2.

Figure 3E:
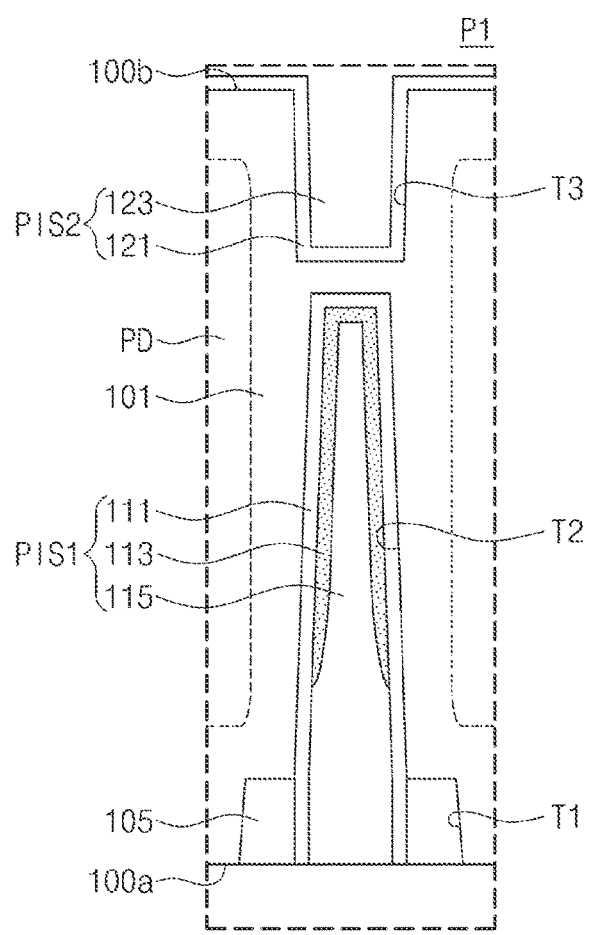
Figure 4:
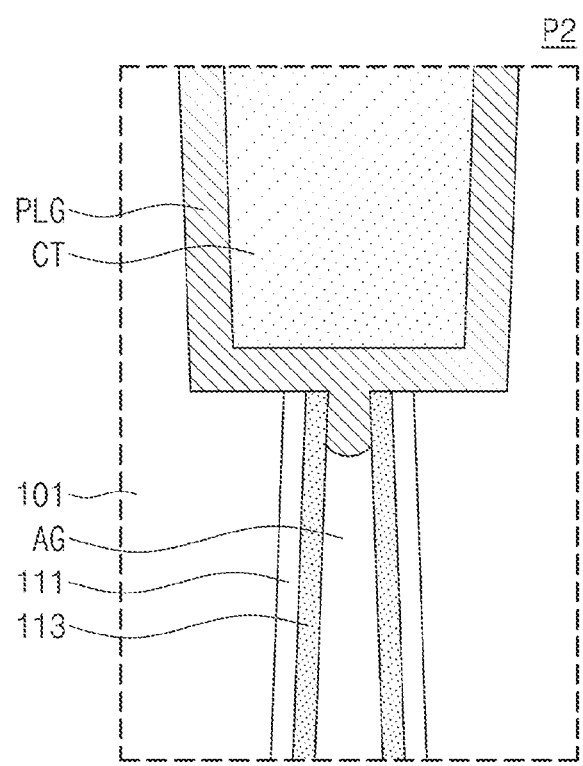
FIG. 4 is an enlarged view of a portion 'P2' of FIG. 2 illustrating a portion of an image sensor according to some embodiments of the inventive concept.

According to an embodiment illustrated in FIG. 3E, the first pixel isolation structure PIS1 may be vertically spaced apart from the second pixel isolation structure PIS2. Thus, a bottom portion of the liner insulating pattern 111 may be in contact with the semiconductor substrate 101. In other words, a portion of the semiconductor substrate 101 may exist between a bottom surface of the liner insulating pattern 111 and the second pixel isolation structure PIS2.

The liner semiconductor pattern 113 may include an undoped poly-silicon layer or a poly-silicon layer doped with dopants. Dopants in the liner semiconductor pattern 113 may have the same conductivity type as those in the semiconductor substrate 101. The dopants in the liner semiconductor pattern 113 may include at least one of, for example, boron (B), phosphorus (P), arsenic (As), gallium (Ga), indium (In), antimony (Sb), or aluminum (Al).

The liner semiconductor pattern 113 may be spaced apart from the semiconductor substrate 101 by the liner insulating pattern 111. Thus, when the image sensor operates, the liner semiconductor pattern 113 may be electrically isolated from the semiconductor substrate 101.

The liner semiconductor pattern 113 may have a single body provided throughout a pixel array region. In other words, the liner semiconductor pattern 113 may have a single body provided in common in the central region CR and the edge region ER.

The liner semiconductor pattern 113 may be connected to a backside contact plug PLG in the edge region ER. A negative bias may be applied to the liner semiconductor pattern 113 through a contact pattern CT and the backside contact plug PLG. Thus, a dark current occurring at a boundary between the first pixel isolation structure PIS1 and the semiconductor substrate 101 may be reduced in embodiments.

The capping insulating pattern 115 may be disposed in the gap region defined by the liner semiconductor pattern 113. The capping insulating pattern 115 may cover the liner semiconductor pattern 113 and may cover an upper sidewall of the liner insulating pattern 111. The capping insulating pattern 115 may have a top surface located at substantially the same level as the top surface of the device isolation layer 105. For example, the capping insulating pattern 115 may include at least one of a silicon oxide layer, a silicon oxynitride layer, or a silicon nitride layer.

In addition, a potential barrier region PBR including dopants having the first conductivity type may be disposed in the semiconductor substrate 101 adjacent to a sidewall of the first pixel isolation structure PIS1. The potential barrier region PBR may include the dopants having the same conductivity type (e.g., the P-type) as the semiconductor substrate 101. A concentration of the dopants in the potential barrier region PBR may be higher than a concentration of the dopants in the semiconductor substrate 101. The potential barrier region PBR may reduce a dark current generated by electron-hole pairs (EHPs) generated by surface defects of the second trench T2 caused when the second trench T2 is formed.

Figure 3F:
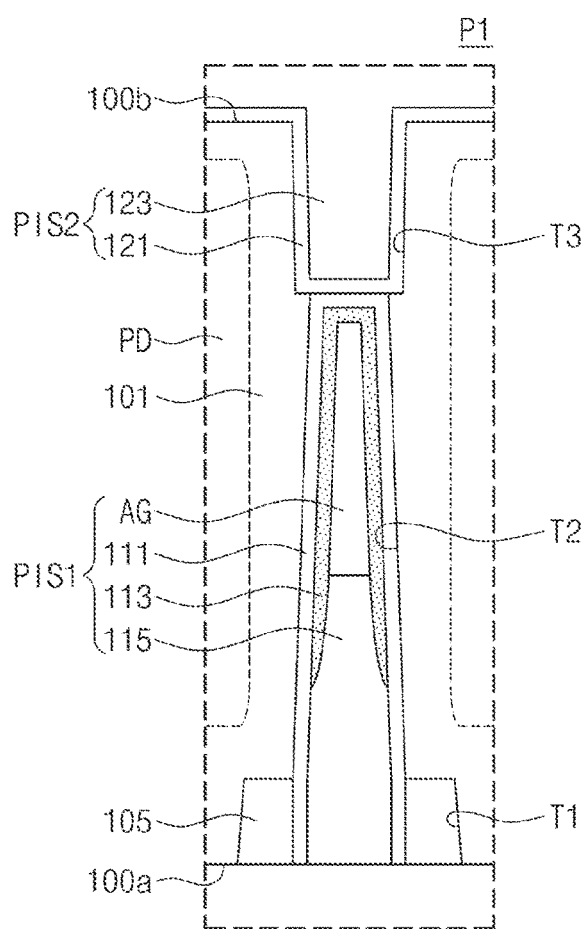
Figure 3G:
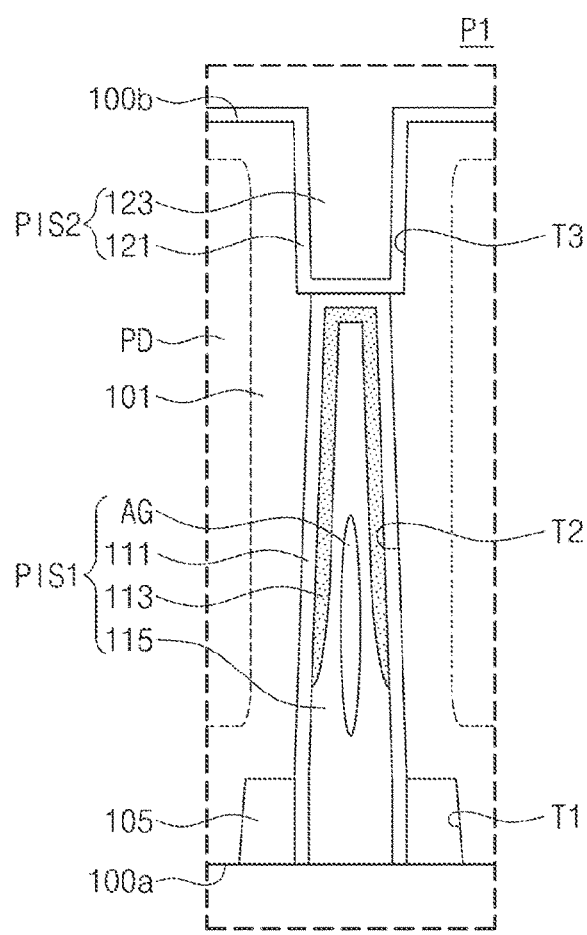
Figure 3H:
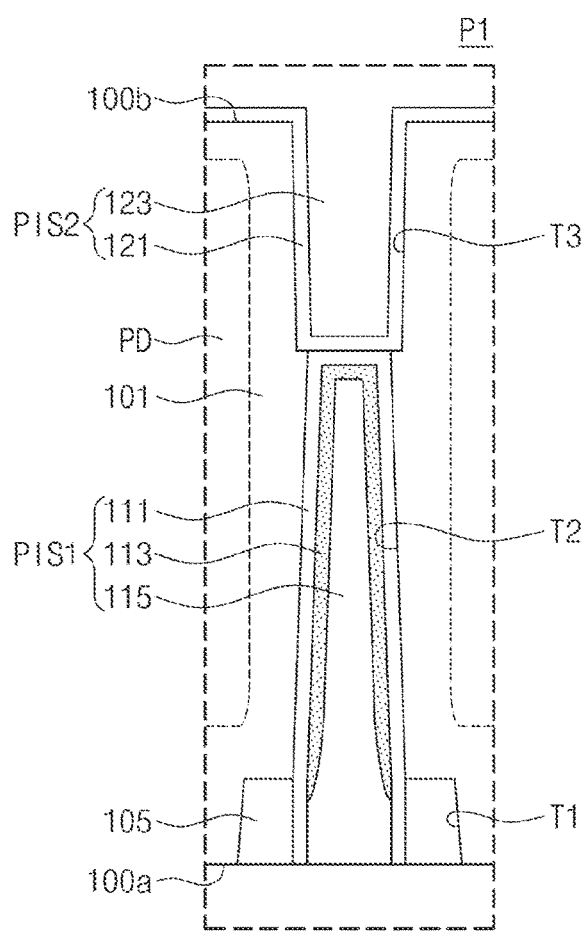
Figure 3I:
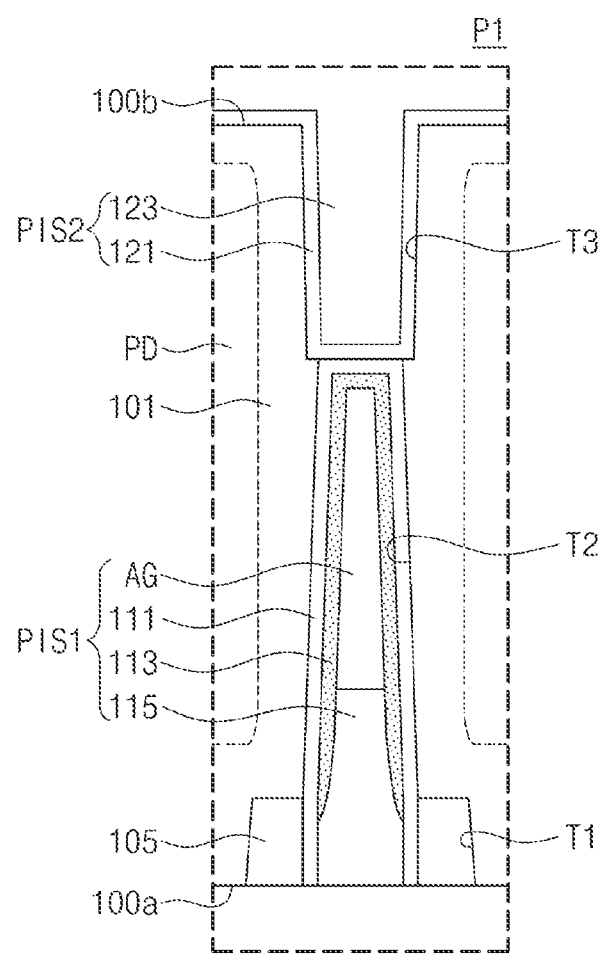

According to embodiments illustrated in FIGS. 3F, 3G and 3I, the first pixel isolation structure PIS1 may further include an air gap AG or a void, which is defined in the gap region of the liner semiconductor pattern 113.

Referring to FIG. 3F, a bottom surface of the capping insulating pattern 115 may be vertically spaced apart from the bottom portion of the liner semiconductor pattern 113, and thus the air gap AG may be defined in the gap region of the liner semiconductor pattern 113. In other words, portions of the sidewall portions and the bottom portion of the liner semiconductor pattern 113 may define the air gap AG. The bottom surface of the capping insulating pattern 115 may be located at a lower or higher level than the top surfaces of the sidewall portions of the liner semiconductor pattern 113, with respect to the first surface 100a of the semiconductor substrate 101. In addition, the bottom surface of the capping insulating pattern 115 may be rounded.

Referring to FIG. 3G, the capping insulating pattern 115 with a non-uniform thickness may cover the liner semiconductor pattern 113, and the air gap AG surrounded by the capping insulating pattern 115 may be defined in the gap region of the liner semiconductor pattern 113.

Referring again to FIGS. 1 and 2, the second pixel isolation structure PIS2 may extend from the second surface 100b of the semiconductor substrate 101 in a vertical direction (e.g., an opposite direction to the third direction D3) and may be disposed in the semiconductor substrate 101. The second pixel isolation structure PIS2 may be disposed in a third trench T3 recessed from the second surface 100b of the semiconductor substrate 101.

The second pixel isolation structure PIS2 may have a bottom surface between the first surface 100a and the second surface 100b of the semiconductor substrate 101. In other words, the second pixel isolation structure PIS2 may be spaced apart from the first surface 100a of the semiconductor substrate 101. The second pixel isolation structure PIS2 may be in contact with the first pixel isolation structure PIS1.

The second pixel isolation structure PIS2 may have a second upper width at the second surface 100b of the semiconductor substrate 101 and may have a second lower width at the bottom surface thereof. The second lower width may be less than or substantially equal to the second upper width. A width of the second pixel isolation structure PIS2 may become progressively less from the second surface 100b toward the first surface 100a of the semiconductor substrate 101.

The second pixel isolation structure PIS2 may have substantially the same planar structure as the first pixel isolation structure PIS1. The second pixel isolation structure PIS2 may overlap the first pixel isolation structure PIS1 when viewed in a plan view. In other words, the second pixel isolation structure PIS2 may include first portions extending in the first direction D1, and second portions intersecting the first portions and extending in the second direction D2.

The second pixel isolation structure PIS2 may have a second length in a vertical direction (e.g., the third direction D3), and the second length may be different from the first length of the first pixel isolation structure PIS1. For example, the second length of the second pixel isolation structure PIS2 may be less than or substantially equal to the first length.

The second pixel isolation structure PIS2 may include at least one or more high-k dielectric layers having dielectric constants higher than that of a silicon oxide layer. For example, the second pixel isolation structure PIS2 may include a surface dielectric layer 121 and a gap-fill dielectric layer 123.

The surface dielectric layer 121 may cover an inner surface of the third trench T3 and the second surface 100b of the semiconductor substrate 101 with a substantially uniform thickness. The gap-fill dielectric layer 123 may fill the third trench T3 having the surface dielectric layer 121 and may have a substantially flat top surface on the second surface 100b of the semiconductor substrate 101. For example, each of the surface and gap-fill dielectric layers 121 and 123 may include a metal oxide layer or metal fluoride layer including at least one of hafnium (Hf), zirconium (Zr), aluminum (Al), tantalum (Ta), titanium (Ti), yttrium (Y), or a lanthanoid (e.g., La). For example, the surface dielectric layer 121 may include an aluminum oxide layer, and the gap-fill dielectric layer 123 may include a hafnium oxide layer.

Referring to FIGS. 3A and 3B, the surface dielectric layer 121 of the second pixel isolation structure PIS2 may be in contact with the liner insulating pattern 111 of the first pixel isolation structure PIS1.

Referring to FIG. 3C, the surface dielectric layer 121 of the second pixel isolation structure PIS2 may be in contact with the bottom portion of the liner semiconductor pattern 113 of the first pixel isolation structure PIS1.

Referring to FIG. 3D, a center of the second pixel isolation structure PIS2 may be misaligned with a center of the first pixel isolation structure PIS1. In this case, the second pixel isolation structure PIS2 may be in contact with a portion of a bottom surface of the first pixel isolation structure PIS1.

Referring to FIG. 3E, the second pixel isolation structure PIS2 may overlap the first pixel isolation structure PIS1 but may be vertically spaced apart from the first pixel isolation structure PIS1. In other words, a portion of the semiconductor substrate 101 may exist between the first pixel isolation structure PIS1 and the second pixel isolation structure PIS2.

Referring again to FIGS. 1 and 2, the photoelectric conversion region PD may be disposed in the semiconductor substrate 101 of each of the pixel regions PR. The photoelectric conversion regions PD may generate photocharges in proportion to the intensity of incident light. The photoelectric conversion regions PD may be formed by ion-implanting dopants of a second conductivity type into the semiconductor substrate 101. The second conductivity type may be opposite to the first conductivity type of the semiconductor substrate 101. Photodiodes may be formed by junction of the semiconductor substrate 101 having the first conductivity type and the photoelectric conversion regions PD having the second conductivity type.

In some embodiments, a dopant concentration of a region of the photoelectric conversion region PD adjacent to the first surface 100a may be different from a dopant concentration of another region of the photoelectric conversion region PD adjacent to the second surface 100b, and thus, the photoelectric conversion region PD may have a potential gradient between the first surface 100a and the second surface 100b of the semiconductor substrate 101. For example, each of the photoelectric conversion regions PD may include a plurality of dopant regions vertically stacked.

In each of the pixel regions PR and the dummy pixel regions DPR, a transfer gate electrode TG may be disposed on the first surface 100a of the semiconductor substrate 101. The transfer gate electrode TG may be disposed in a central portion of each of the pixel regions PR when viewed in a plan view. A portion of the transfer gate electrode TG may be disposed in the semiconductor substrate 101, and a gate insulating layer GIL may be disposed between the transfer gate electrode TG and the semiconductor substrate 101.

A floating diffusion region FD may be disposed in the semiconductor substrate 101 at a side of the transfer gate electrode TG. The floating diffusion region FD may be formed by ion-implanting dopants having an opposite conductivity type to that of the semiconductor substrate 101. For example, the floating diffusion region FD may be an N-type dopant region.

The readout circuit layer 20 may be disposed on the first surface 100a of the semiconductor substrate 101. The readout circuit layer 20 may include readout circuits connected to the photoelectric conversion layer 10. Electrical signals converted in the photoelectric conversion layer 10 may be processed in the readout circuit layer 20.

More particularly, the readout circuit layer 20 may include MOS transistors (e.g., a reset transistor, a source follower transistor, and a selection transistor).

Interlayer insulating layers 210 may be stacked on the first surface 100a of the semiconductor substrate 101. The interlayer insulating layers 210 may cover the MOS transistors of the readout circuits and the transfer gate electrodes TG. For example, the interlayer insulating layers 210 may include at least one of silicon oxide, silicon nitride, or silicon oxynitride.

An interconnection structure 221 and 223 connected to the readout circuits may be disposed in the interlayer insulating layers 210. The interconnection structure 221 and 223 may include metal interconnection lines 223 and contact plugs 221 connecting the metal interconnection lines 223.

The light transmitting layer 30 may be disposed on the second surface 100b of the semiconductor substrate 101. In the central region CR, the light transmitting layer 30 may include a grid structure 310, a protective layer 320, color filters 330, micro lenses 340, and a passivation layer 350. In the edge region ER, the light transmitting layer 30 may include a light blocking pattern OBP, the backside contact plug PLG, the contact pattern CT, an organic layer 345, and the passivation layer 350.

In the central region CR, the grid structure 310 may be disposed on the top surface of the gap-fill dielectric layer 123. Like the first and second pixel isolation structures PIS 1 and PIS2, the grid structure 310 may have a grid shape when viewed in a plan view. The grid structure 310 may overlap the first and second pixel isolation structures PIS1 and PIS2 when viewed in a plan view. In other words, the grid structure 310 may include first portions extending in the first direction D1, and second portions extending in the second direction D2 to intersect the first portions. A width of the grid structure 310 may be substantially equal to or less than minimum widths of the first and second pixel isolation structures PIS1 and PIS2.

The grid structure 310 may include a conductive pattern and/or a low-refractive index pattern. For example, the conductive pattern may include a metal material such as titanium, tantalum, or tungsten. The low-refractive index pattern may be formed of a material having a refractive index lower than that of the conductive pattern. The low-refractive index pattern may be formed of an organic material and may have a refractive index of about 1.1 to about 1.3. For example, the grid structure 310 may be a polymer layer including silica nanoparticles.

In the central region CR, the protective layer 320 may have a substantially uniform thickness and may conformally cover a surface of the grid structure 310 on the top surface of the gap-fill dielectric layer 123. For example, the protective layer 320 may include a single-layer or multi-layer including at least one of an aluminum oxide layer or a silicon oxycarbide layer.

In the central region CR, the color filters 330 may be provided on the protective layer 320 to correspond to the pixel regions PR, respectively. The color filters 330 may include blue, red and green color filters. In embodiments, the color filters 330 may include magenta, cyan and yellow color filters. In embodiments, some of the color filters 330 may include a white color filter or an infrared filter.

The micro lenses 340 may be disposed on the color filters 330 to correspond to the pixel regions PR, respectively. In embodiments, at least one of the micro lenses 340 may be disposed on at least two color filters.

The micro lenses 340 may be two-dimensionally arranged in the first and second directions D1 and D2 intersecting each other. Each of the micro lenses 340 may have an upwardly convex shape and may have a specific radius of curvature. The micro lenses 340 may change a path of light incident on the image sensor to concentrate light. The micro lenses 340 may be formed of a light transmitting resin.

The passivation layer 350 may conformally cover top surfaces of the micro lenses 340. The passivation layer 350 may be formed of, for example, an inorganic oxide.

In the edge region ER, the backside contact plug PLG may penetrate a portion of the second pixel isolation structure PIS2 and a portion of the semiconductor substrate 101 to be connected to the liner semiconductor pattern 113 of the first pixel isolation structure PIS1. A negative bias voltage may be applied to the backside contact plug PLG when the image sensor operates.

The backside contact plug PLG may have a width greater than a width of the second pixel isolation structure PIS2. The backside contact plug PLG may penetrate a portion of the first portion and a portion of the second portion of the second pixel isolation structure PIS2, which intersect each other. A bottom surface of the backside contact plug PLG may be farther from the second surface 100b of the semiconductor substrate 101 than a bottom surface of the second pixel isolation structure PIS2. In other words, the bottom surface of the backside contact plug PLG may be located at a lower level than the bottom surface of the second pixel isolation structure PIS2, from the second surface 100b of the semiconductor substrate 101.

The backside contact plug PLG may include a metal and/or a metal nitride. For example, the backside contact plug PLG may include titanium and/or titanium nitride.

Referring to FIG. 4, more particularly, the backside contact plug PLG may conformally cover an inner surface of a contact hole formed by recessing the second surface 100b of the semiconductor substrate 101. The backside contact plug PLG may be in contact with the sidewall portions of the liner semiconductor pattern 113. In the case that the first pixel isolation structure PIS1 includes the air gap AG, a portion of the backside contact plug PLG may be inserted into a portion of the gap region of the liner semiconductor pattern 113. Thus, the backside contact plug PLG may be in contact with portions of inner sidewalls of the sidewall portions of the liner semiconductor pattern 113.

The contact pattern CT may fill the contact hole having the backside contact plug PLG. The contact pattern CT may include a different material from that of the backside contact plug PLG. For example, the contact pattern CT may include aluminum (Al).

The contact pattern CT may be electrically connected to the liner semiconductor pattern 113 of the first pixel isolation structure PIS 1. A negative bias may be applied to the liner semiconductor pattern 113 of the first pixel isolation structure PIS1 through the contact pattern CT, and the negative bias may be transmitted from the edge region ER to the central region CR.

In the edge region ER, the light blocking pattern OBP may extend continuously from the backside contact plug PLG to be disposed on the top surface of the gap-fill dielectric layer 123 of the second pixel isolation structure PIS2. In other words, the light blocking pattern OBP may include the same material as the backside contact plug PLG. The light blocking pattern OBP may include a metal and/or a metal nitride. For example, the light blocking pattern OBP may include titanium and/or titanium nitride. In an embodiment, the light blocking pattern OBP does not extend into the central region CR of a pixel array.

The protective layer 320 may cover a top surface of the light blocking pattern OBP and a top surface of the contact pattern CT.

The organic layer 345 and the passivation layer 350 may be provided on the protective layer 320 in the edge region ER. The organic layer 345 may include the same material as the micro lenses 340.

FIGS. 5 to 14 are cross-sectional views taken along the line I-I' of FIG. 1 illustrating a method of manufacturing an image sensor according to some embodiments of the inventive concept.

Figure 5:
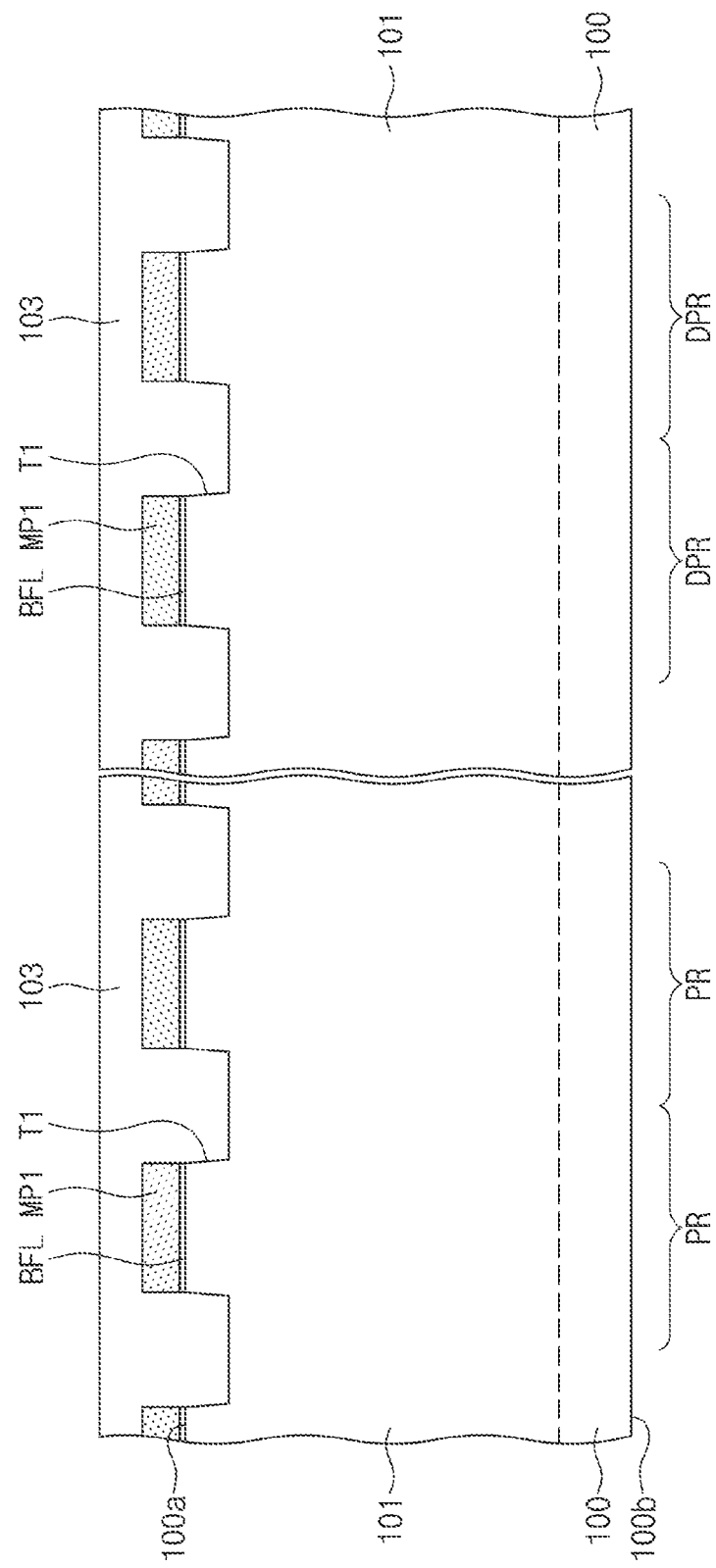
FIGS. 5 to 14 are cross-sectional views taken along line I-I' of FIG. 1 illustrating a method of manufacturing an image sensor according to some embodiments of the inventive concept.

Referring to FIGS. 1 and 5, a semiconductor substrate 101 having a first conductivity type (e.g., a P-type) may be provided. The semiconductor substrate 101 may have a first surface 100a and a second surface 100b which are opposite to each other. The semiconductor substrate 101 may include an epitaxial layer which has the first conductivity type and is formed on a bulk silicon substrate 100 having the first conductivity type. Alternatively, the semiconductor substrate 101 may be a bulk semiconductor substrate including a well having the first conductivity type. In certain embodiments, the semiconductor substrate 101 may be a silicon-on-insulator (SOI) substrate, a germanium substrate, a germanium-on-insulator (GOI) substrate, or a silicon-germanium (SiGe) substrate.

The semiconductor substrate 101 (e.g., the epitaxial layer) may be formed by performing a selective epitaxial growth (SEG) process using the bulk silicon substrate 100 as a seed and may be doped with dopants having the first conductivity type during the SEG process. For example, the epitaxial layer may include P-type dopants.

A first trench T1 may be formed by patterning the first surface 100a of the semiconductor substrate 101. The first trench T1 may define active portions in each of pixel regions PR and dummy pixel regions DPR.

A buffer layer BFL and a first mask pattern MP1 may be sequentially formed on the first surface 100a of the semiconductor substrate 101, and the semiconductor substrate 101 may be anisotropically etched using the first mask pattern MP1 as an etch mask to form the first trench T1.

The buffer layer BFL may be formed by performing a deposition process or a thermal oxidation process on the first surface 100a of the semiconductor substrate 101. The buffer layer BFL may include a silicon oxide layer. For example, the first mask pattern MP1 may include silicon nitride or silicon oxynitride.

Next, a filling insulation layer 103 may be formed to fill the first trench T1. The filling insulation layer 103 may be formed by thickly depositing an insulating material on the semiconductor substrate 101 having the first trench T1. The filling insulation layer 103 may fill the first trench T1 and may cover the first mask pattern MP1.

Figure 6:
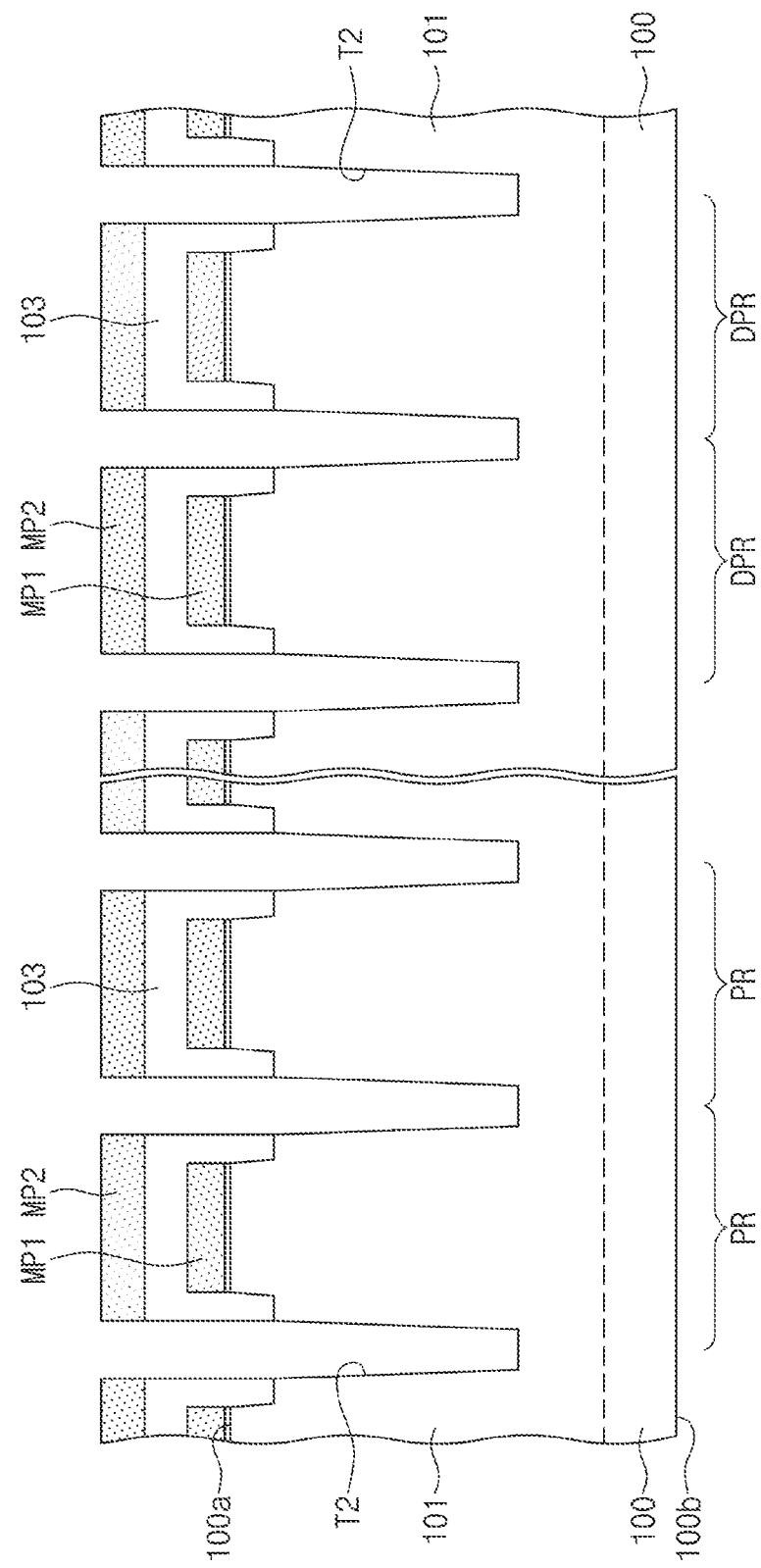

Referring to FIGS. 1 and 6, a second trench T2 may be formed to define the pixel regions PR and the dummy pixel regions DPR. The second trench T2 may be formed by patterning the filling insulation layer 103 and the first surface 100a of the semiconductor substrate 101.

For example, a second mask pattern MP2 may be formed on the filling insulation layer 103, and the semiconductor substrate 101 may be anisotropically etched using the second mask pattern MP2 as an etch mask to form the second trench T2.

The second trench T2 may vertically extend from the first surface 100a toward the second surface 100b of the semiconductor substrate 101 and may expose an inner sidewall of the epitaxial layer. The second trench T2 may be deeper than the first trench T1 and may penetrate a portion of the first trench T1.

The second trench T2 may include a plurality of first regions extending in the first direction D1 and having uniform widths, and a plurality of second regions extending in the second direction D2 intersecting the first direction D1 and having uniform widths, when viewed in a plan view.

The second trench T2 may be formed by performing the anisotropic etching process, and thus the width of the second trench T2 may become progressively less from the first surface 100a toward the second surface 100b of the semiconductor substrate 101. In other words, the second trench T2 may have an inclined sidewall. A bottom surface of the second trench T2 may be spaced apart from the second surface 100b of the semiconductor substrate 101.

The second mask pattern MP2 may be removed after the formation of the second trench T2. In addition, a potential barrier region (see PBR of FIG. 3A) including dopants having the first conductivity type may be formed along an inner sidewall of the second trench T2 after the formation of the second trench T2. For example, the potential barrier region may include P-type dopants.

Figure 7:
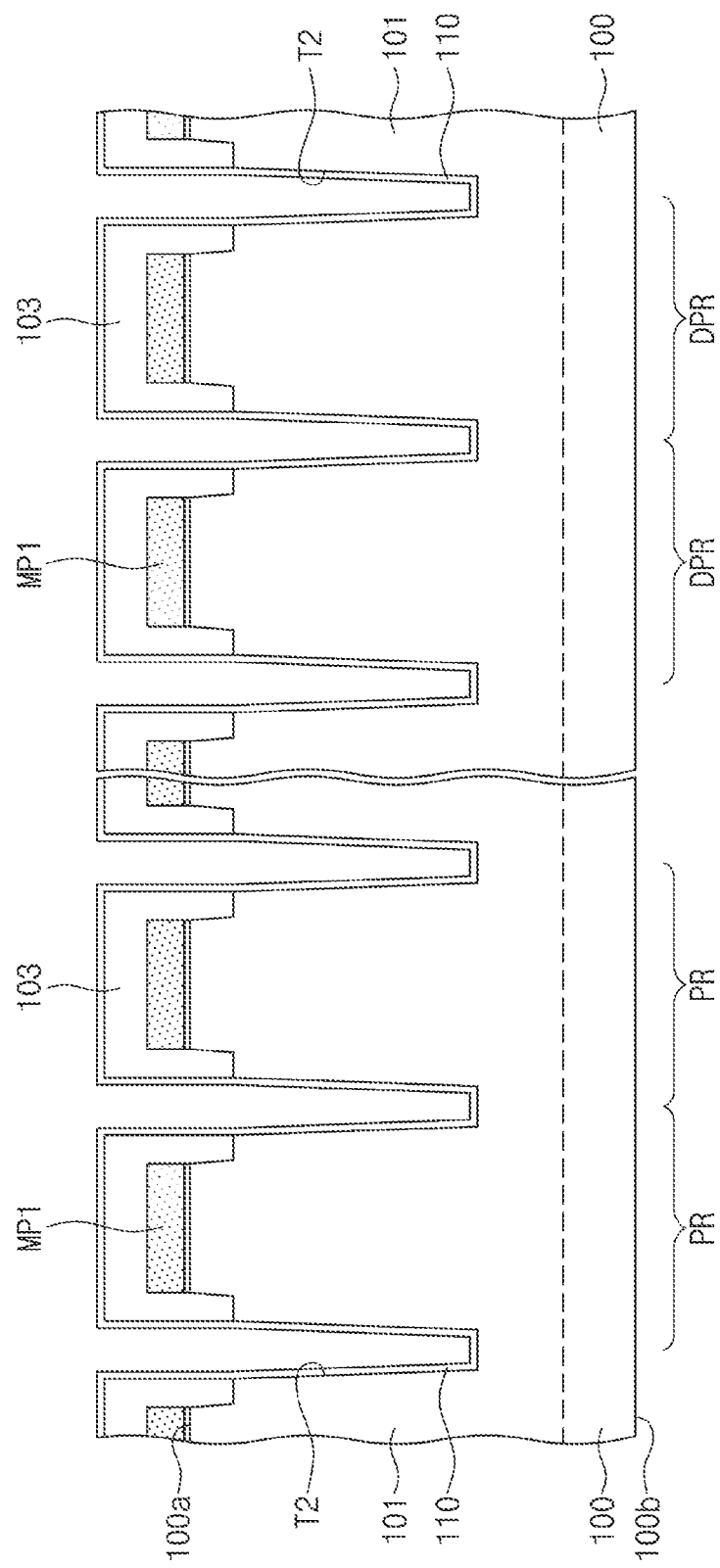

Referring to FIGS. 1 and 7, a liner insulating layer 110 may be formed to conformally cover an inner surface of the second trench T2. The liner insulating layer 110 may conformally cover a top surface of the filling insulation layer 103. The liner insulating layer 110 may be deposited using a deposition method having an excellent step coverage property. For example, the liner insulating layer 110 may include at least one of silicon oxide, silicon nitride, or silicon oxynitride.

Figure 8:
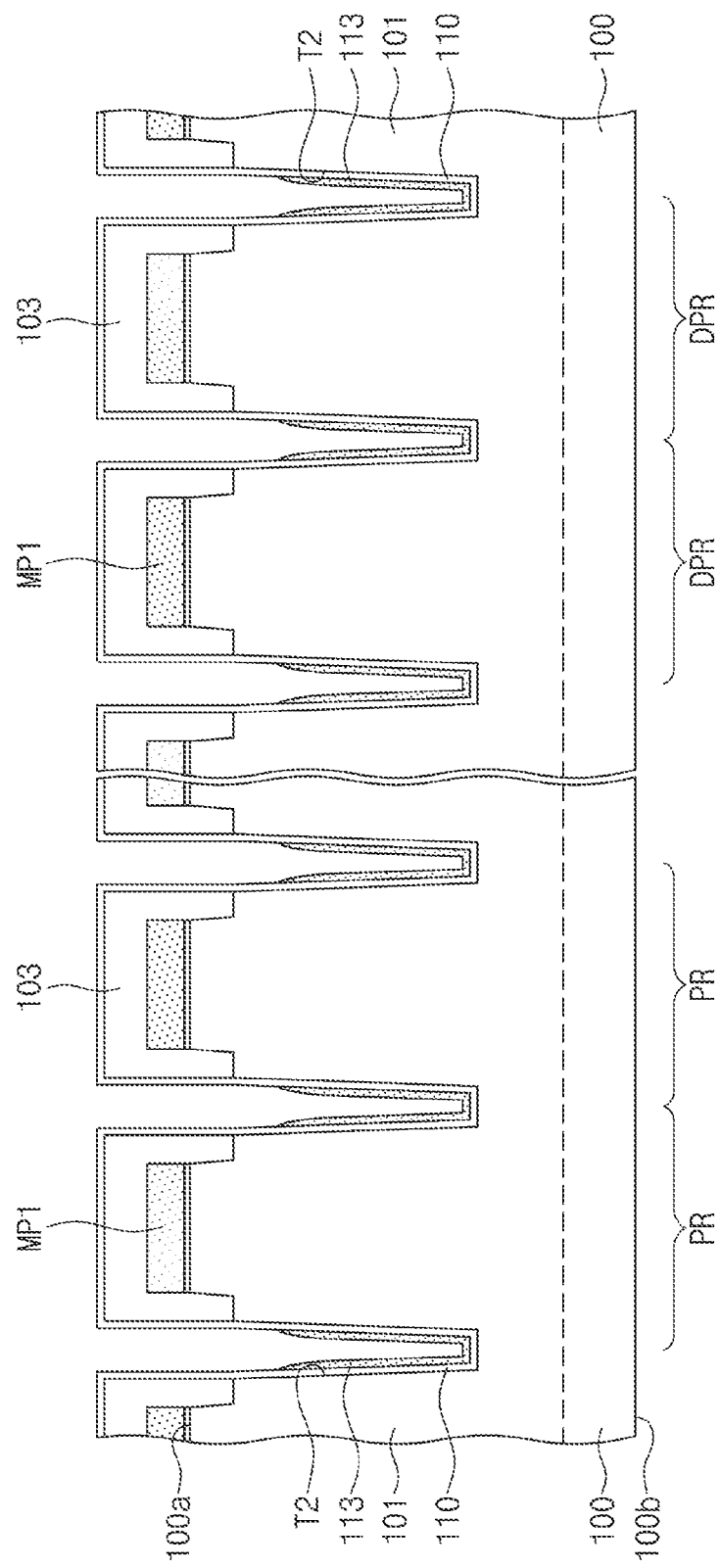

Referring to FIGS. 1 and 8, a liner semiconductor pattern 113 may be formed on the liner insulating layer 110. The formation of the liner semiconductor pattern 113 may include performing a deposition process of a liner semiconductor layer and an etching process of the liner semiconductor layer in-situ.

The liner semiconductor layer may be formed using at least one of a low-pressure chemical vapor deposition (LP-CVD) technique, a plasma-enhanced CVD (PE-CVD) technique, or an atomic layer deposition (ALD) technique.

In some embodiments, a source gas including dopants having the first conductivity type may be used in the deposition process of the liner semiconductor layer. The source gas may include a first gas including a silane-based compound, and a second gas including a compound including the dopants (e.g., boron (B)). The first gas and the second gas may chemically react with each other to form the liner semiconductor layer. The liner semiconductor layer formed as described above may have a substantially uniform dopant concentration regardless of a position. The liner semiconductor layer may include poly-crystalline silicon or amorphous silicon, which includes the dopants having the first conductivity type.

For example, the deposition process of the liner semiconductor layer may use $SiH_4$ (or $Si_2H_6$) and $BCl_3$ (or $B_2H_6$) and may be performed at a low temperature of about 300 degrees Celsius to about 530 degrees Celsius.

An etchant gas including chlorine may be used in the etching process of the liner semiconductor layer. In the etching process of the liner semiconductor layer, an etch rate may be higher on the first surface 100a of the semiconductor substrate 101 than on the inner surface of the second trench T2. Thus, the liner semiconductor layer on the first surface 100a of the semiconductor substrate 101 may be etched to expose the liner insulating layer 110, and the liner semiconductor layer may remain in the second trench T2.

The deposition and etching processes of the liner semiconductor layer may be repeatedly performed until a top surface of the liner semiconductor pattern 113 is located at a lower level than a bottom surface of the first trench T1. Alternatively, the deposition and etching processes of the liner semiconductor layer may be repeatedly performed to allow the top surface of the liner semiconductor pattern 113 to be located at a level lower than the first surface 100a of the semiconductor substrate 101 and higher than the bottom surface of the first trench T1.

The liner semiconductor pattern 113 formed as described above may include sidewall portions on inner sidewalls of the second trench T2 and a bottom portion on the bottom surface of the second trench T2. In addition, the sidewall portions of the liner semiconductor pattern 113 may have spacer shapes tapered toward the first surface 100a of the semiconductor substrate 101.

Figure 9:
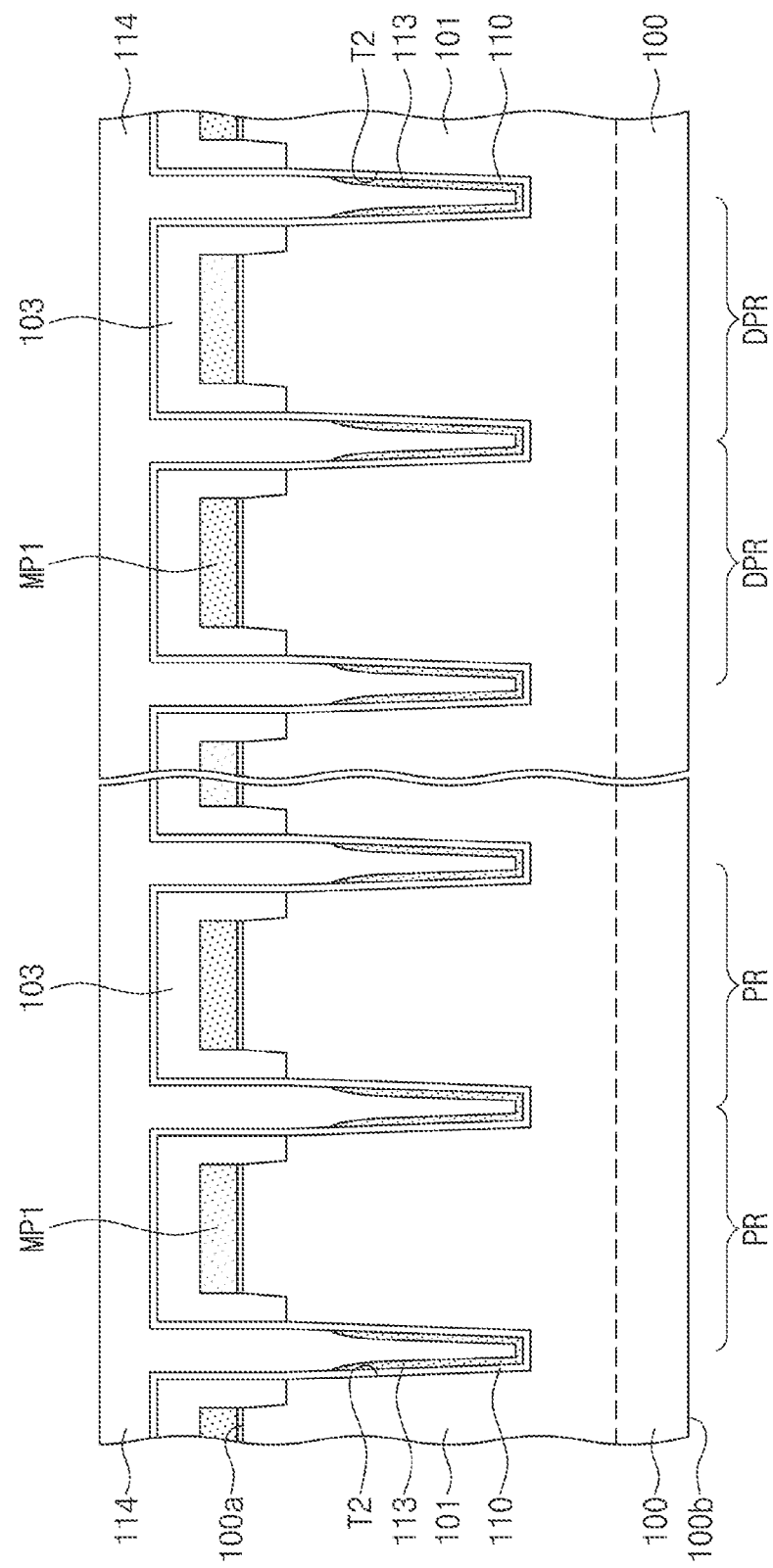

Referring to FIGS. 1 and 9, a capping insulating layer 114 may be formed to fill the second trench T2 having the liner semiconductor pattern 113.

The capping insulating layer 114 may cover the liner insulating layer 110 on the first surface 100a of the semiconductor substrate 101. For example, the capping insulating layer 114 may include at least one of silicon oxide, silicon nitride, or silicon oxynitride.

The capping insulating layer 114 may be formed by a layer-formation technique having an excellent property of step coverage, e.g., a CVD technique or an ALD technique. In this case, the capping insulating layer 114 may cover the sidewall portions and the bottom portion of the liner semiconductor pattern 113 in the second trench T2.

Alternatively, the capping insulating layer 114 may be formed by a deposition method having a poor property of step coverage. For example, the capping insulating layer 114 may be formed using a physical vapor deposition (PVD) method. In this case, the capping insulating layer 114 may form an air gap AG in the second trench T2, as illustrated in FIGS. 3F and 3G. Since the deposition process having the poor property of step coverage is used, the air gap AG may expose the bottom portion and portions of the sidewall portions of the liner semiconductor pattern 113, as illustrated in FIG. 3F.

Figure 10:
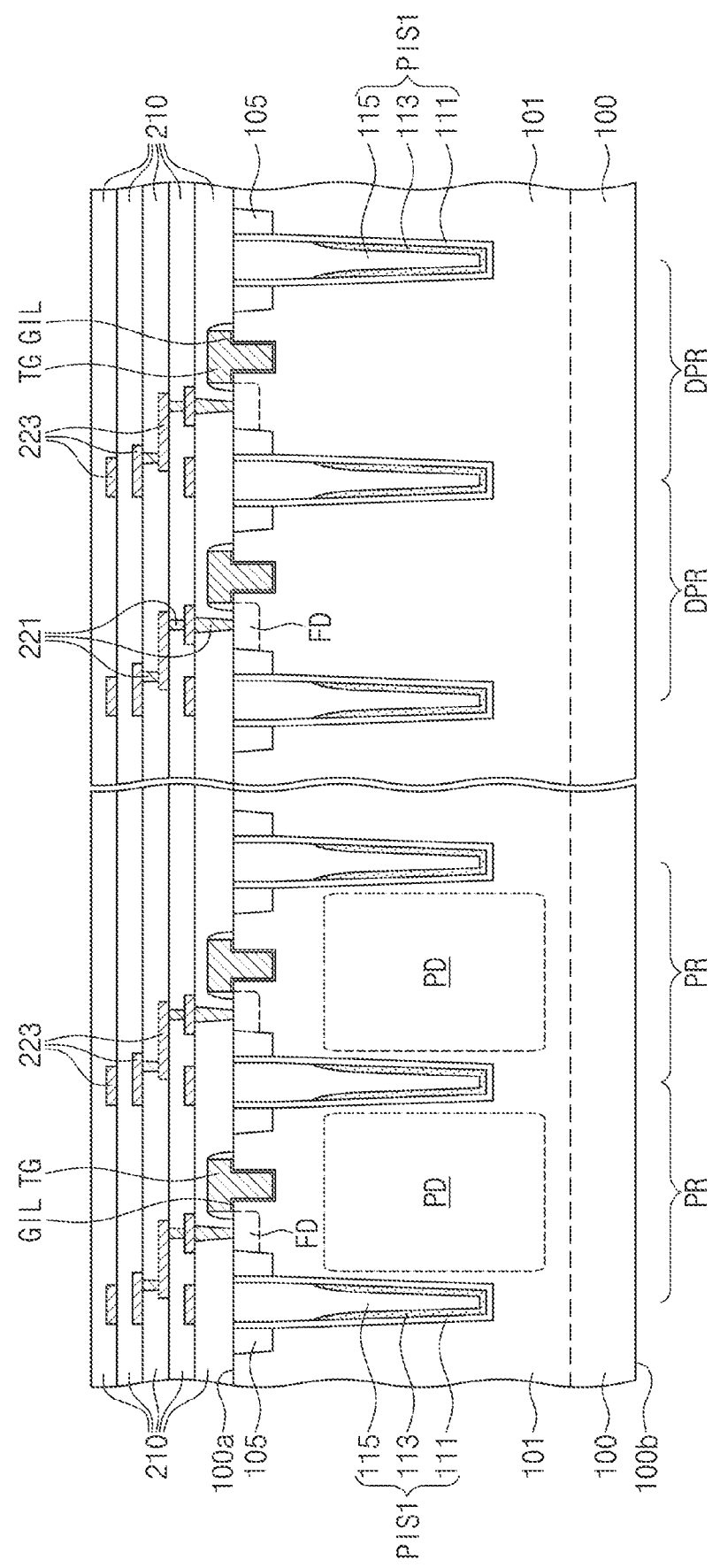

Subsequently, the liner insulating layer 110 and the capping insulating layer 114 may be planarized to expose a top surface of the first mask pattern MP1, and thus a liner insulating pattern 111, the liner semiconductor pattern 113 and a capping insulating pattern 115 may be formed in the second trench T2, as illustrated in FIG. 10. As a result, a first pixel isolation structure PIS1 may be formed in the second trench T2.

After the formation of the first pixel isolation structure PIS1, the first mask pattern MP1 may be removed, and the filling insulation layer 103 may be planarized to expose the first surface 100a of the semiconductor substrate 101, thereby forming a device isolation layer 105 in the first trench T1. By the planarization process exposing the first surface 100a of the semiconductor substrate 101, a top surface of the first pixel isolation structure PIS1 may be substantially coplanar with a top surface of the device isolation layer 105.

Referring still to FIG. 10, MOS transistors constituting readout circuits may be formed on the first surface 100a of the semiconductor substrate 101.

For example, transfer gate electrodes TG may be formed in the pixel regions PR and the dummy pixel regions DPR, respectively. The formation of the transfer gate electrodes TG may include patterning the semiconductor substrate 101 to form a gate recess region in each of the pixel regions PR and the dummy pixel regions DPR, forming a gate insulating layer conformally covering inner surfaces of the gate recess regions, forming a gate conductive layer filling the gate recess regions, and patterning the gate conductive layer.

In addition, when the transfer gate electrodes TG are formed by patterning the gate conductive layer, gate electrodes of readout transistors may also be formed in each of the pixel regions PR.

After the formation of the transfer gate electrodes TG, a floating diffusion region FD may be formed in the semiconductor substrate 101 at a side of each of the transfer gate electrodes TG. The floating diffusion regions FD may be formed by ion-implanting dopants having a second conductivity type. In addition, when the floating diffusion regions FD are formed, source/drain dopant regions of the readout transistors may be formed.

Interlayer insulating layers 210, contact plugs 221 and metal interconnection lines 223 may be formed on the first surface 100a of the semiconductor substrate 101.

The interlayer insulating layers 210 may cover the transfer gate electrodes TG and the first surface 100a of the semiconductor substrate 101. The interlayer insulating layers 210 may be formed of a material having an excellent gap-fill property, and an upper portion of the interlayer insulating layers 210 may be planarized. For example, the interlayer insulating layers 210 may be formed of a high-density plasma (HDP) oxide, Tonen silazene (TOSZ), spin-on-glass (SOG), and/or undoped silica glass (USG).

The contact plugs 221 may be formed in the interlayer insulating layers 210 and may be connected to the floating diffusion regions FD and/or the readout transistors. The metal interconnection lines 223 may be formed between the interlayer insulating layers 210. The metal interconnection lines 223 for electrical connection of the readout transistors may be disposed without position limitation. For example, the contact plugs 221 and the metal interconnection lines 223 may be formed of at least one of copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or an alloy of a combination thereof.

Figure 11:
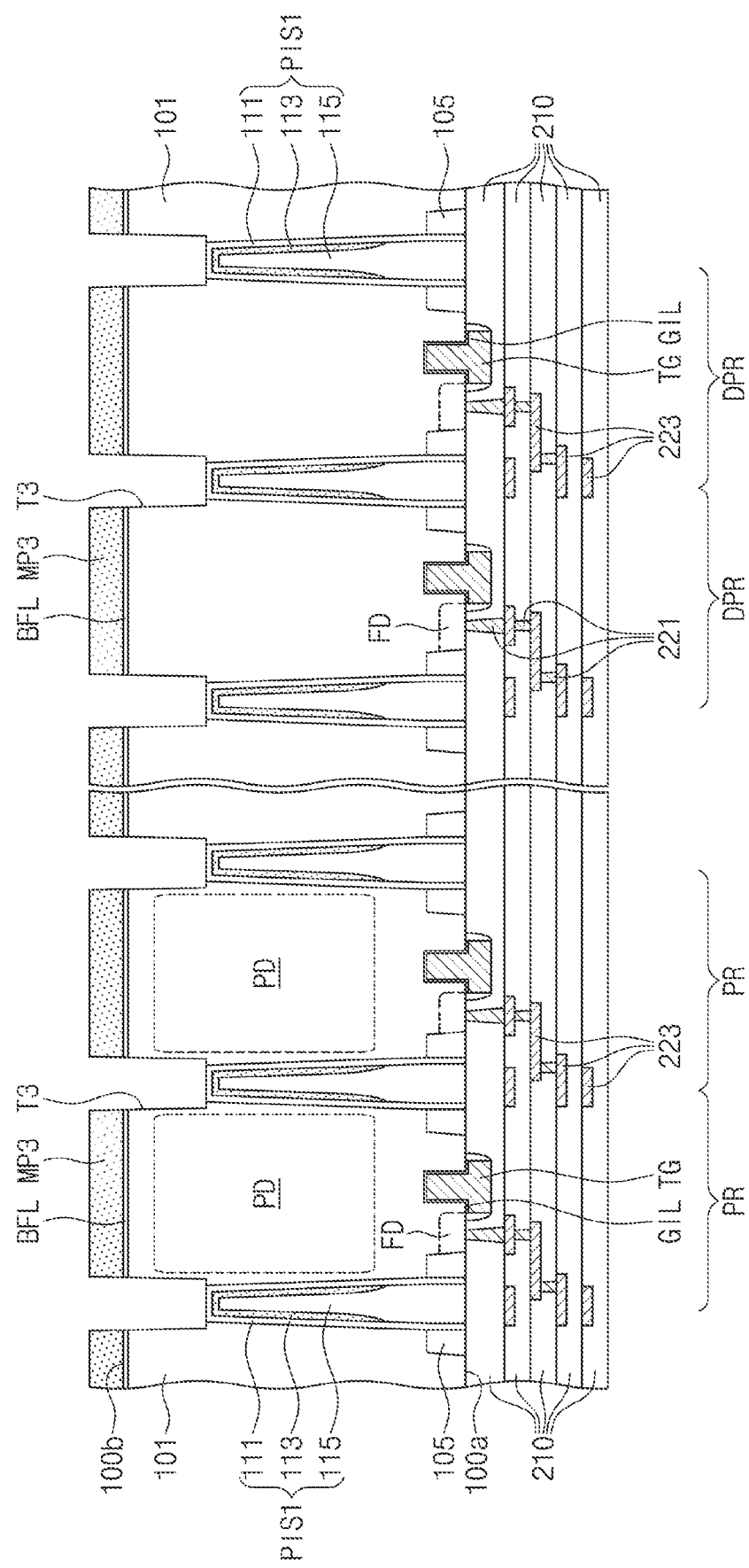

Referring to FIGS. 1 and 11, a thinning process of removing a portion of the semiconductor substrate 101 may be performed to reduce a vertical thickness of the semiconductor substrate 101. The thinning process may include grinding or polishing the second surface 100b of the semiconductor substrate 101 and anisotropically and/or isotropically etching the second surface 100b of the semiconductor substrate 101. To thin the semiconductor substrate 101, the semiconductor substrate 101 may be turned over. A portion of the semiconductor substrate 101 may be removed by the grinding or polishing process, and then, the anisotropic or isotropic etching process may be performed to remove remaining surface defects of the semiconductor substrate 101.

For example, by the thinning process performed on the semiconductor substrate 101, the bulk silicon substrate 100 may be removed and the P-type epitaxial layer may remain. In some embodiments, a thickness of the semiconductor substrate 101 remaining after the thinning process may range from about 8 µm to about 15 µm.

Next, a third trench T3 may be formed by patterning the second surface 100b of the semiconductor substrate 101.

A buffer layer BFL and a third mask pattern MP3 may be sequentially formed on the second surface 100b of the semiconductor substrate 101, and the semiconductor substrate 101 may be anisotropically etched using the third mask pattern MP3 as an etch mask to form the third trench T3.

The buffer layer BFL may be formed by performing a deposition process or a thermal oxidation process on the second surface 100b of the semiconductor substrate 101. The buffer layer BFL may include a silicon oxide layer. For example, the third mask pattern MP3 may include silicon nitride or silicon oxynitride.

The third trench T3 may expose the first pixel isolation structure PIS1. The third trench T3 may expose the liner insulating pattern 111 or the liner semiconductor pattern 113 of the first pixel isolation structure PIS1.

Figure 12:
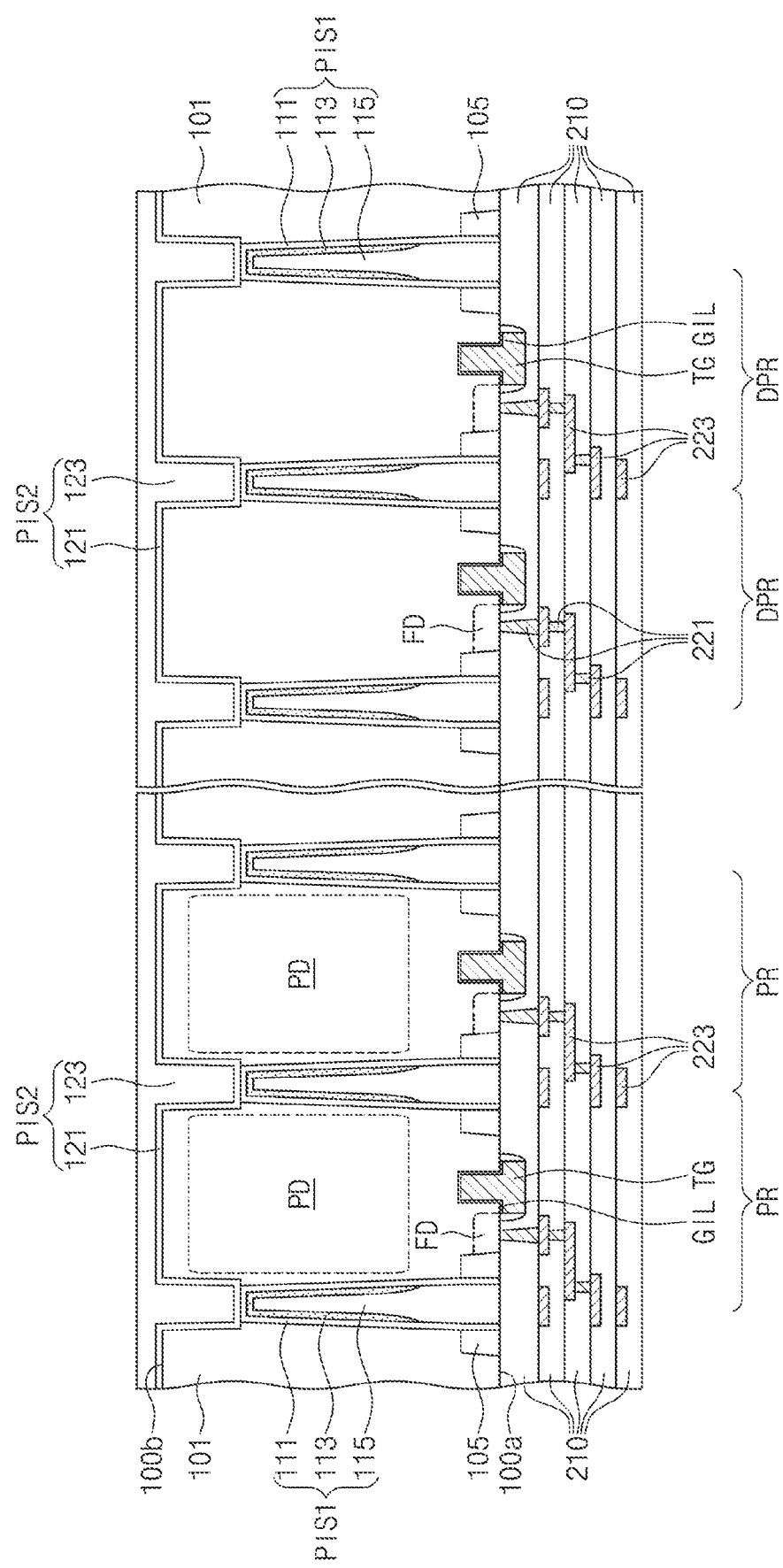

Referring to FIGS. 1 and 12, a surface dielectric layer 121 and a gap-fill dielectric layer 123 may be sequentially stacked in the third trench T3. Due to the formation of the surface dielectric layer 121 and the gap-fill dielectric layer 123, a second pixel isolation structure PIS2 may be formed in the third trench T3.

The surface dielectric layer 121 may be conformally deposited on an inner surface of the third trench T3 and the second surface 100b of the semiconductor substrate 101. The surface and gap-fill dielectric layers 121 and 123 may be formed by performing ALD processes. The gap-fill dielectric layer 123 may fill the third trench T3 having the surface dielectric layer 121 and may have a substantially flat top surface on the second surface 100b of the semiconductor substrate 101. Each of the surface and gap-fill dielectric layers 121 and 123 may include a metal oxide such as aluminum oxide and/or hafnium oxide.

Figure 13:
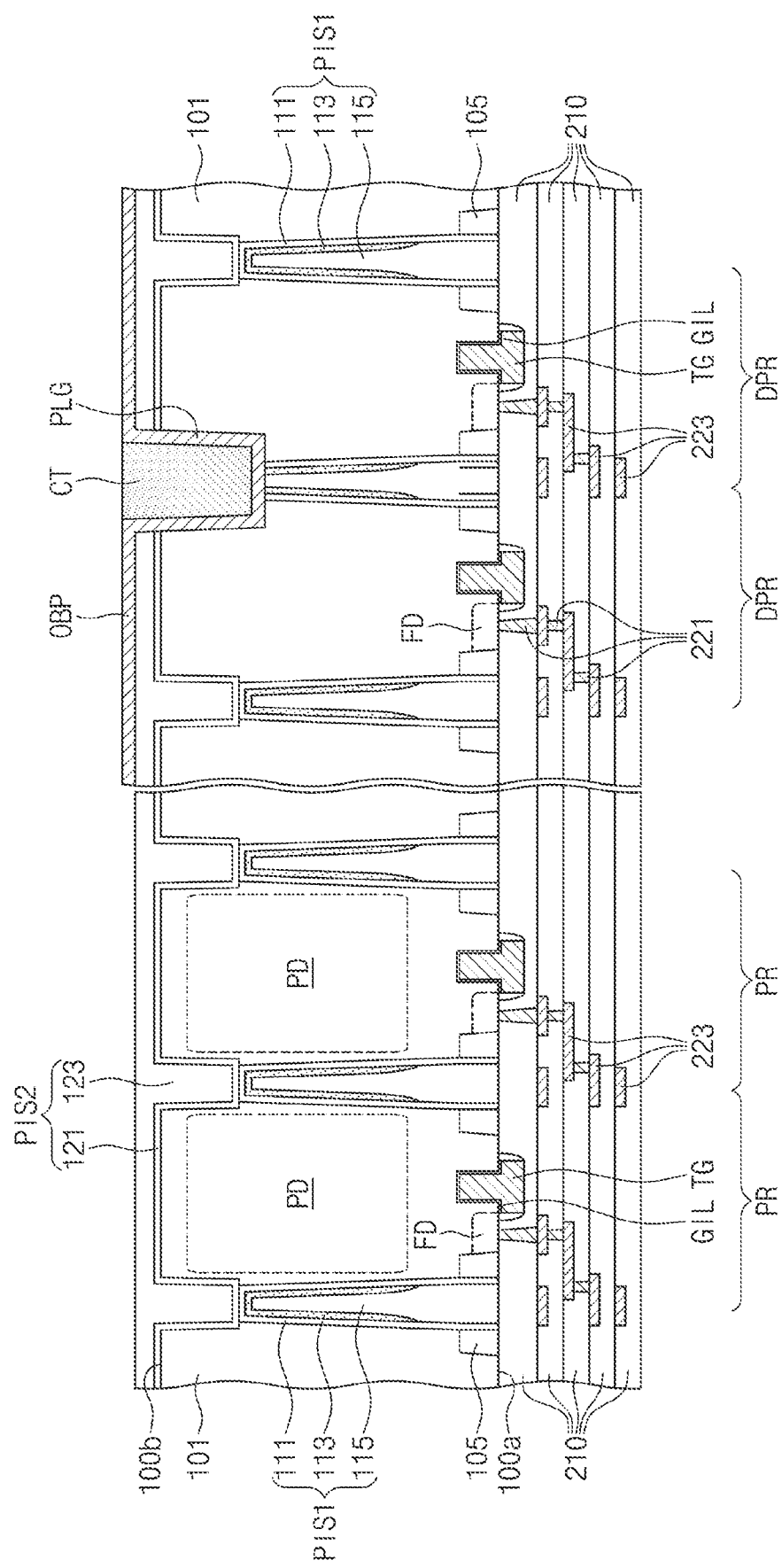

Referring to FIGS. 1 and 13, in the edge region ER, a contact hole may be formed to penetrate a portion of the semiconductor substrate 101 and a portion of the second pixel isolation structure PIS2. The contact hole may expose a portion of the liner semiconductor pattern 113 of the first pixel isolation structure PIS1.

A conductive layer may be deposited on an inner surface of the contact hole and the top surface of the gap-fill dielectric layer 123. After the deposition of the conductive layer, a patterning process may be performed on the conductive layer to remove the conductive layer from the central region CR. Thus, a light blocking pattern OBP and a backside contact plug PLG may be formed in the edge region ER. For example, the conductive layer may include a metal such as copper, tungsten, aluminum, titanium, tantalum, or any alloy thereof.

Subsequently, the contact hole having the backside contact plug PLG may be filled with a contact pattern CT. The contact pattern CT may include a different conductive material from that of the backside contact plug PLG. For example, the contact pattern CT may include aluminum.

Figure 14:
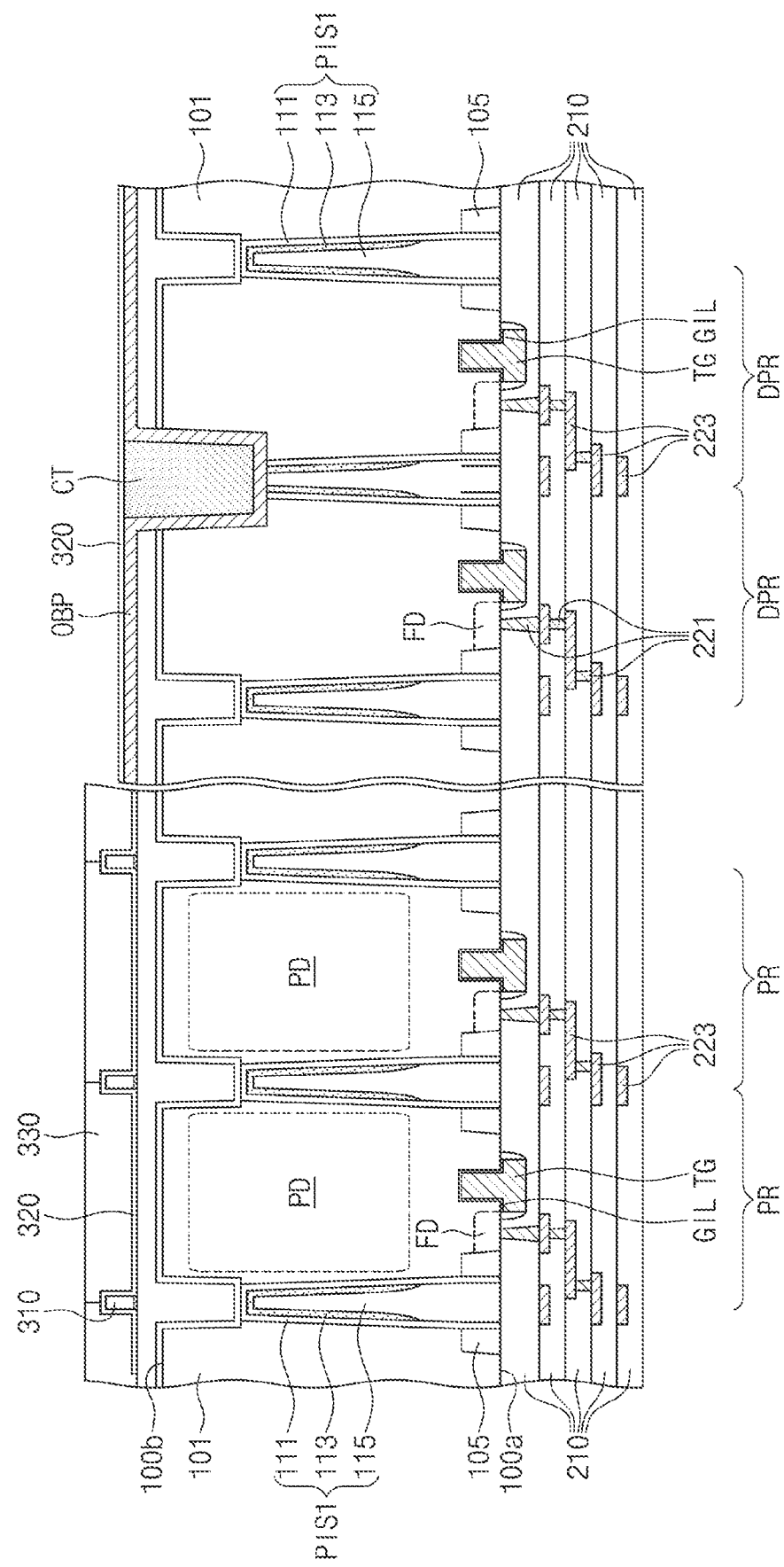

Referring to FIGS. 1 and 14, a grid structure 310 may be formed on the top surface of the gap-fill dielectric layer 123. The grid structure 310 may extend in the first direction D1 and the second direction D2 and may have a grid shape. A conductive layer and a low-refractive index layer may be sequentially deposited and then may be patterned to form the grid structure 310. The grid structure 310 may include a conductive pattern and/or a low-refractive index pattern. For example, the conductive pattern may include a metal material such as titanium, tantalum, or tungsten. The low-refractive index pattern may be formed of a material having a refractive index lower than that of the conductive pattern.

A protective layer 320 may be formed on the top surface of the gap-fill dielectric layer 123 to cover a surface of the grid structure 310 with a substantially uniform thickness. The protective layer 320 may extend from the central region CR into the edge region ER and may cover a top surface of the light blocking pattern OBP and a top surface of the contact pattern CT in the edge region ER. For example, the protective layer 320 may include a single-layer or multi-layer including at least one of an aluminum oxide layer or a silicon oxycarbide layer.

After the formation of the protective layer 320, color filters 330 may be formed to correspond to the pixel regions PR, respectively. The color filters 330 may include blue, red and green color filters.

Referring again to FIG. 2, next, micro lenses 340 may be formed on the color filters 330, respectively. Each of the micro lenses 340 may have a convex shape and may have a specific radius of curvature. The micro lenses 340 may be formed of a light transmitting resin.

After the formation of the micro lenses 340, a passivation layer 350 may be formed to conformally cover top surfaces of the micro lenses 340. The passivation layer 350 may be formed of, for example, an inorganic oxide.

Figure 15:
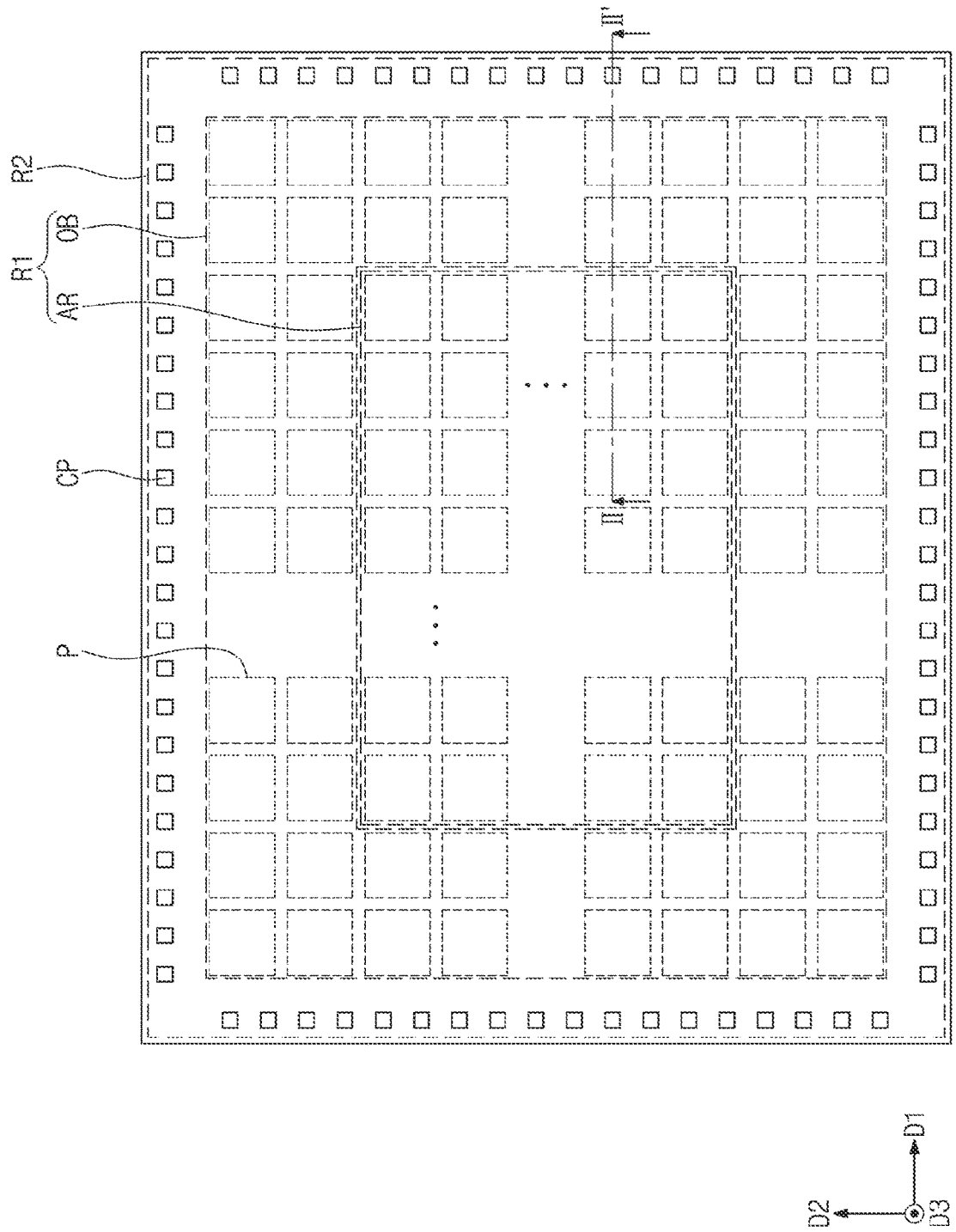
FIG. 15 is a plan view schematically illustrating an image sensor according to some embodiments of the inventive concept.
Figure 16:
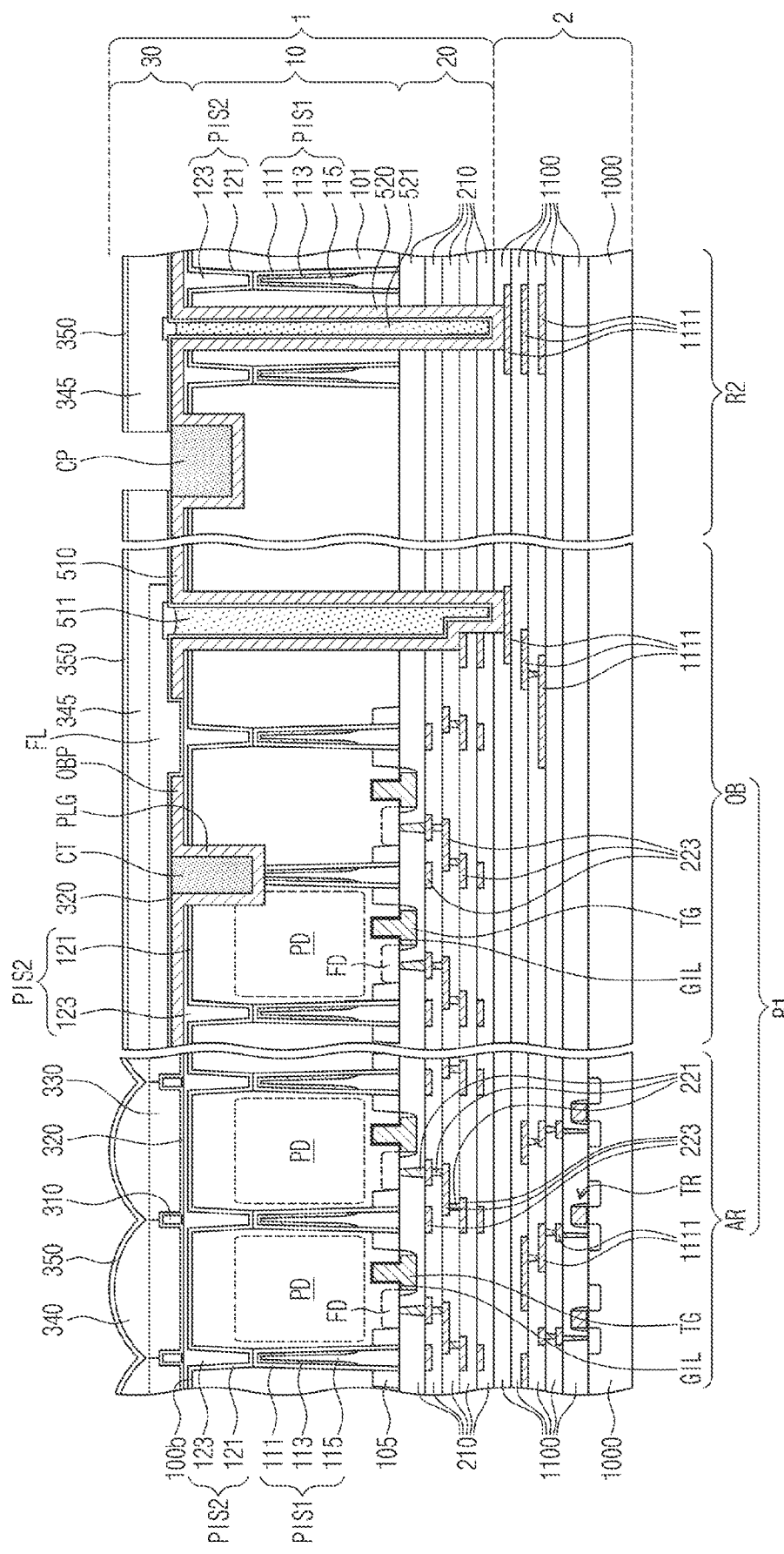
FIGS. 16 and 17 are cross-sectional views taken along line II-II' of FIG. 15 illustrating image sensors according to some embodiments of the inventive concept.
Figure 17:
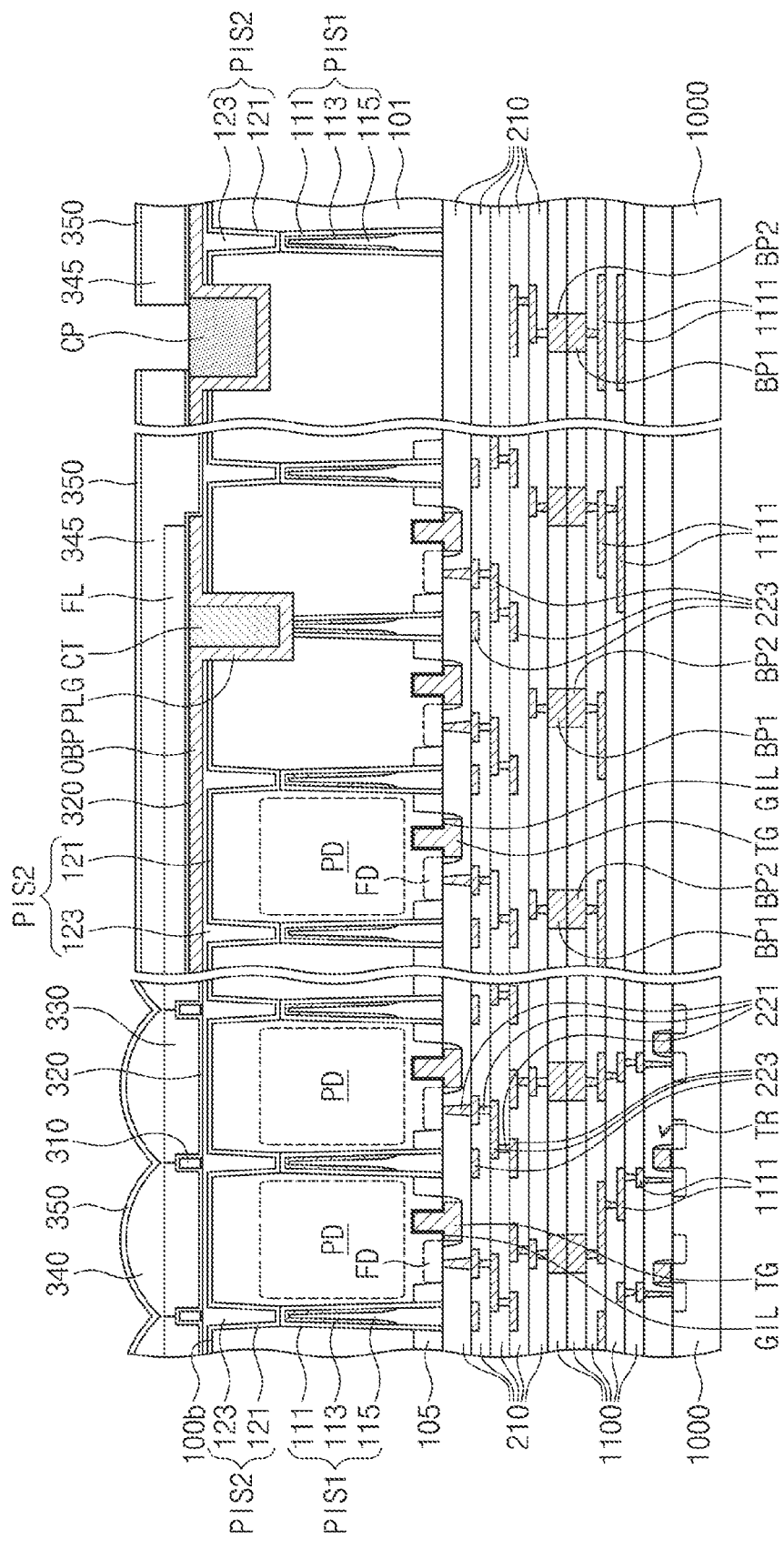

FIG. 15 is a plan view schematically illustrating an image sensor according to some embodiments of the inventive concept. FIGS. 16 and 17 are cross-sectional views taken along line II-II' of FIG. 15 illustrating image sensors according to some embodiments of the inventive concept.

Referring to FIGS. 15 and 16, an image sensor may include a sensor chip 1 and a logic chip 2. The sensor chip 1 may include a pixel array region R1 and a pad region R2.

The pixel array region R1 may include a plurality of unit pixels P two-dimensionally arranged in first and second directions D1 and D2 intersecting each other. Each of the unit pixels P may include a photoelectric conversion element and readout elements. An electrical signal generated by incident light may be outputted from each of the unit pixels P of the pixel array region R1.

The pixel array region R1 may include a light receiving region AR and a light blocking region OB. The light blocking region OB may surround the light receiving region AR when viewed in a plan view. In other words, the light blocking region OB may be disposed at top, bottom, left and right sides of the light receiving region AR when viewed in a plan view. Reference pixels to which light is not incident may be disposed in the light blocking region OB. The amounts of charges sensed from the unit pixels P of the light receiving region AR may be compared with a reference charge amount generated from the reference pixels to calculate magnitudes of electrical signals sensed from the unit pixels P.

A plurality of conductive pads CP used to input/output control signals and photoelectric signals may be disposed in the pad region R2. The pad region R2 may surround the pixel array region R1 in a plan view, and thus, the pad region R2 may be easily connected to external devices. Electrical signals generated from the unit pixels P may be outputted to an external device through the conductive pads CP.

The sensor chip 1 may include the photoelectric conversion layer 10, the readout circuit layer 20, and the light transmitting layer 30, described above. The photoelectric conversion layer 10 may be disposed between the readout circuit layer 20 and the light transmitting layer 30 in a cross-sectional view.

As described above, the photoelectric conversion layer 10 of the sensor chip 1 may include the semiconductor substrate 101, the first and second pixel isolation structures PIS1 and PIS2 defining the pixel regions, and the photoelectric conversion regions PD disposed in the pixel regions. Here, the semiconductor substrate 101 may correspond to the epitaxial layer in the aforementioned embodiments.

The sensor chip 1 in the light receiving region AR may include the same technical features as the image sensor described above.

The first and second pixel isolation structures PIS1 and PIS2 may be disposed in the semiconductor substrate 101 of the light blocking region OB. A portion of the first pixel isolation structure PIS1 may be connected to a backside contact plug PLG in the light blocking region OB.

The gap-fill dielectric layer 123 may extend from the light receiving region AR into the light blocking region OB and the pad region R2.

A light blocking pattern OBP may be disposed on the gap-fill dielectric layer 123 in the light blocking region OB. The light blocking pattern OBP may prevent light from being incident into the photoelectric conversion regions PD disposed in the light blocking region OB. In an embodiment, the photoelectric conversion regions PD in reference pixel regions of the light blocking region OB do not output photoelectric signals but may output noise signals. The noise signal may be generated by electrons generated by occurrence of heat or a dark current. For example, the light blocking pattern OBP may include a metal such as tungsten, copper, aluminum, or any alloy thereof.

A protective layer 320 may extend from the pixel array region R1 into the pad region R2. The protective layer 320 may cover a top surface of the light blocking pattern OBP.

A filtering layer FL may cover the protective layer 320 in the light blocking region OB. The filtering layer FL may block light having a different wavelength from those of the color filters 330. For example, the filtering layer FL may block infrared light. The filtering layer FL may include, but is not limited to, a blue color filter.

In the light blocking region OB, a first through-conductive pattern 510 may penetrate the semiconductor substrate 101 to be electrically connected to the metal interconnection line 223 of the readout circuit layer 20 and an interconnection structure 1111 of the logic chip 2. The first through-conductive pattern 510 may have a first bottom surface and a second bottom surface, which are located at different levels. A first filling pattern 511 may be disposed in an inner space surrounded by the first through-conductive pattern 510. The first filling pattern 511 may include a low-refractive index material and may have an insulating property.

In the pad region R2, the conductive pads CP may be provided at the second surface 100b of the semiconductor substrate 101. The conductive pads CP may be buried in the second surface 100b of the semiconductor substrate 101. For example, the conductive pads CP may be disposed in pad trenches formed in the second surface 100b of the semiconductor substrate 101 in the pad region R2. The conductive pads CP may include a metal such as aluminum, copper, tungsten, titanium, tantalum, or any alloy thereof. In a mounting process of the image sensor, bonding wires may be bonded to the conductive pads CP. The conductive pads CP may be electrically connected to an external device through the bonding wires.

In the pad region R2, a second through-conductive pattern 520 may penetrate the semiconductor substrate 101 to be electrically connected to the interconnection structure 1111 of the logic chip 2. The second through-conductive pattern 520 may extend onto the second surface 100b of the semiconductor substrate 101 to be electrically connected to the conductive pad CP. A portion of the second through-conductive pattern 520 may cover a bottom surface and a sidewall of the conductive pad CP. A second filling pattern 521 may be disposed in an inner space surrounded by the second through-conductive pattern 520. The second filling pattern 521 may include a low-refractive index material and may have an insulating property. In the pad region R2, the first and second pixel isolation structures PIS1 and PIS2 may be provided around the second through-conductive pattern 520.

The logic chip 2 may include a logic semiconductor substrate 1000, logic circuits TR, interconnection structures 1111 connected to the logic circuits TR, and logic interlayer insulating layers 1100. An uppermost one of the logic interlayer insulating layers 1100 may be bonded to the readout circuit layer 20 of the sensor chip 1. The logic chip 2 may be electrically connected to the sensor chip 1 through the first through-conductive pattern 510 and the second through-conductive pattern 520.

In embodiments, the sensor chip 1 and the logic chip 2 are electrically connected to each other through the first and second through-conductive patterns 510 and 520. However, embodiments of the inventive concept are not limited thereto.

According to an embodiment illustrated in FIG. 17, the first and second through-conductive patterns 510 and 520 of FIG. 16 may be omitted, and bonding pads of an uppermost metal layer of the sensor chip may be bonded directly to bonding pads of an uppermost metal layer of the logic chip to electrically connect the sensor chip and the logic chip.

For example, the sensor chip 1 may include first bonding pads BP1 disposed in an uppermost metal layer of the readout circuit layer 20, and the logic chip 2 may include second bonding pads BP2 disposed in an uppermost metal layer of the interconnection structures 1111. For example, the first and second bonding pads BP1 and BP2 may include at least one of tungsten (W), aluminum (Al), copper (Cu), tungsten nitride (WN), tantalum nitride (TaN), or titanium nitride (TiN).

The first bonding pads BP1 of the sensor chip 1 may be electrically connected directly to the second bonding pads BP2 of the logic chip 2 by a hybrid bonding method. The hybrid bonding may mean that two components including the same kind of a material are fused together at their interface. For example, when the first and second bonding pads BP1 and BP2 are formed of copper (Cu), the first and second bonding pads BP1 and BP2 may be physically and electrically connected to each other by copper-copper (Cu—Cu) bonding. In addition, a surface of an insulating layer of the sensor chip 1 and a surface of an insulating layer of the logic chip 2 may be bonded to each other by dielectric-dielectric bonding.

According to embodiments of the inventive concept, the amount of a conductive semiconductor material having a high light absorption rate may be reduced in the pixel isolation structure. Thus, incident light may be inhibited from being absorbed into the semiconductor material of the pixel isolation structure, and a negative voltage may be applied to the semiconductor material of the pixel isolation structure to reduce a dark current caused by defects at an interface between the semiconductor substrate and the pixel isolation structure. As a result, electrical and optical characteristics of the image sensor may be improved.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. An image sensor, comprising:
a semiconductor substrate having a first surface and a second surface opposite to the first surface; and
a pixel isolation structure disposed in the semiconductor substrate,
wherein the pixel isolation structure vertically extends from the first surface of the semiconductor substrate and defines a plurality of pixel regions;
wherein the pixel isolation structure comprises:
a liner pattern, wherein the liner pattern defines a gap region, and comprises a plurality of sidewall portions and a bottom portion connecting the sidewall portions;
a liner insulating pattern disposed between the liner pattern and the semiconductor substrate; and
a capping insulating pattern disposed in the gap region of the liner pattern.

2. The image sensor of claim 1, wherein the pixel isolation structure comprises an air gap defined in the gap region by the capping insulating pattern.

3. The image sensor of claim 1, wherein the pixel isolation structure comprises a plurality of first portions extending in a first direction and a plurality of second portions intersecting the first portions and extending in a second direction, and
wherein the liner pattern continuously extends in the first direction and the second direction.

4. The image sensor of claim 1, wherein a thickness of the bottom portion of the liner pattern is substantially equal to or greater than a thickness of each of the sidewall portions.

5. The image sensor of claim 1, wherein each of upper portions of the sidewall portions of the liner pattern has a thickness which becomes progressively less toward the first surface.

6. The image sensor of claim 1, further comprising:
a device isolation layer adjacent to the first surface of the semiconductor substrate in each of the pixel regions,
wherein top surfaces of the sidewall portions of the liner pattern are located at a level between a bottom surface of the device isolation layer and the first surface of the semiconductor substrate.

7. The image sensor of claim 1, wherein the liner pattern and the semiconductor substrate comprise dopants having a first conductivity type.

8. The image sensor of claim 1, further comprising:
a plurality of photoelectric conversion regions respectively disposed in the pixel regions and comprising dopants having a second conductivity type,
wherein the sidewall portions of the liner pattern surround each of the photoelectric conversion regions when viewed in a plan view.

9. The image sensor of claim 1, further comprising:
a backside contact plug penetrating a portion of the semiconductor substrate and connected to the liner pattern.

10. The image sensor of claim 9, wherein the pixel isolation structure has a maximum width at the first surface of the semiconductor substrate, and
wherein the backside contact plug has a width greater than the maximum width of the pixel isolation structure.

11. An image sensor, comprising:
a semiconductor substrate having a first surface and a second surface opposite to the first surface;
a pixel isolation structure,
wherein the pixel isolation structure vertically extends from the first surface toward the second surface and surrounds each of a plurality of pixel regions, and comprises a liner pattern comprising a plurality of sidewall portions and a bottom portion connecting the sidewall portions; and
a backside contact plug,
wherein the backside contact plug penetrates a portion of the semiconductor substrate and is connected to the liner pattern of the pixel isolation structure.

12. The image sensor of claim 11, wherein the backside contact plug is in contact with the sidewall portions of the liner pattern.

13. The image sensor of claim 11, wherein a width of the backside contact plug is greater than a width of the pixel isolation structure in a first direction.

14. The image sensor of claim 11, wherein the backside contact plug has a width greater than a maximum width of the pixel isolation structure.

15. The image sensor of claim 11, wherein the pixel isolation structure further comprises a liner insulating pattern disposed between the liner pattern and the semiconductor substrate and a capping insulating pattern filling a gap region defined by the bottom portion and the sidewall portions of the liner pattern.

16. The image sensor of claim 11, further comprising:

a device isolation layer adjacent to the first surface of the semiconductor substrate in each of the pixel regions, wherein top surfaces of the sidewall portions of the liner pattern are vertically spaced apart from a bottom surface of the device isolation layer.

17. The image sensor of claim 11, wherein the pixel isolation structure comprises a plurality of first portions extending in a first direction and a plurality of second portions intersecting the first portions and extending in a second direction, and wherein the liner pattern continuously extends in the first direction and the second direction.

18. An image sensor, comprising:

a semiconductor substrate having a first conductivity type, and having a first surface and a second surface opposite to the first surface;

a pixel isolation structure vertically extending from the first surface toward the second surface and surrounding each of a plurality of pixel regions, wherein the pixel isolation structure comprises:

a liner pattern comprising a plurality of sidewall portions and a bottom portion connecting the sidewall portions;

a liner insulating pattern disposed between the semiconductor substrate and the liner pattern; and a capping insulating pattern disposed on the liner pattern;

a photoelectric conversion region disposed in the semiconductor substrate of each of the pixel regions and comprising dopants having a second conductivity type;

a device isolation layer defining an active portion at the first surface of the semiconductor substrate in each of the pixel regions, wherein the device isolation layer is adjacent to the first surface of the semiconductor substrate;

a transfer gate electrode disposed on the active portion of each of the pixel regions;

a backside contact plug penetrating a portion of the semiconductor substrate and connected to the liner pattern of the pixel isolation structure;

a plurality of color filters corresponding to the pixel regions disposed on the second surface of the semiconductor substrate;

a grid structure disposed between the color filters and overlapping the pixel isolation structure; and a plurality of micro lenses disposed on the color filters.

19. The image sensor of claim 18, wherein the liner pattern comprises dopants having the first conductivity type.

20. The image sensor of claim 18, wherein the sidewall portions of the liner pattern surround each of the photoelectric conversion regions of the pixel regions.

* * * * *